United States Patent
Lin et al.

(10) Patent No.: US 10,748,622 B2
(45) Date of Patent: Aug. 18, 2020

(54) STATE ADAPTIVE PREDICTIVE PROGRAMMING

(71) Applicant: SanDisk Technologies LLC, Addison, TX (US)

(72) Inventors: Lei Lin, Fremont, CA (US); Zhuojie Li, San Jose, CA (US); Tai-Yuan Tseng, Milpitas, CA (US); Henry Chin, Fremont, CA (US); Gerrit Jan Hemink, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/283,464

(22) Filed: Feb. 22, 2019

(65) Prior Publication Data

US 2020/0234768 A1    Jul. 23, 2020

Related U.S. Application Data

(60) Provisional application No. 62/794,977, filed on Jan. 21, 2019.

(51) Int. Cl.
| | |
|---|---|
| *G11C 16/10* | (2006.01) |
| *G11C 16/04* | (2006.01) |
| *G11C 16/34* | (2006.01) |
| *G11C 16/26* | (2006.01) |
| *G11C 11/56* | (2006.01) |
| *H01L 27/11565* | (2017.01) |
| *H01L 27/1157* | (2017.01) |
| *H01L 27/11582* | (2017.01) |

(52) U.S. Cl.
CPC .......... *G11C 16/10* (2013.01); *G11C 16/0483* (2013.01); *G11C 16/3459* (2013.01); *G11C 11/5671* (2013.01); *G11C 16/26* (2013.01); *G11C 2211/5621* (2013.01); *H01L 27/1157* (2013.01); *H01L 27/11565* (2013.01); *H01L 27/11582* (2013.01)

(58) Field of Classification Search
CPC .. G11C 16/10; G11C 16/0483; G11C 16/3459
See application file for complete search history.

(56) References Cited

U.S. PATENT DOCUMENTS

| | | |
|---|---|---|
| 6,738,289 B2 | 5/2004 | Gongwer et al. |
| 7,073,103 B2 | 7/2006 | Gongwer et al. |
| 7,088,621 B2 | 8/2006 | Guterman et al. |

(Continued)

*Primary Examiner* — Tri M Hoang
(74) *Attorney, Agent, or Firm* — Vierra Magen Marcus LLP

(57) ABSTRACT

Techniques are provided for predictively programming of non-volatile memory, which may reduce the number of verify operations. In one aspect, a programming circuit is configured to program memory cells to a verify low voltage and to program a set of the memory cells to target states. The set comprises memory cells having a threshold voltage between the verify low voltage and a verify high voltage. To program the set of the memory cells to the target states, the programming circuit is configured to apply two or more program pulses to memory cells in the set without verifying whether the memory cells have reached their respective target states, including: apply a first and second program enable voltages to the bit lines associated with the memory cells having different strengths.

12 Claims, 26 Drawing Sheets

(56) References Cited

U.S. PATENT DOCUMENTS

| | | |
|---|---|---|
| 7,092,290 B2 | 8/2006 | Hemink |
| 7,345,928 B2 | 3/2008 | Li |
| 7,518,928 B2 | 4/2009 | Guterman et al. |
| 7,643,348 B2 | 1/2010 | Cernea |
| 7,796,435 B2 | 9/2010 | Cernea |
| 8,223,556 B2 | 7/2012 | Dutta et al. |
| 8,705,293 B2 | 4/2014 | She et al. |
| 8,767,487 B2 * | 7/2014 | Goda .................... G11C 16/04 365/189.16 |
| 9,570,179 B2 | 2/2017 | Tseng et al. |
| 9,570,180 B2 * | 2/2017 | Maejima ................ G11C 16/10 |
| 9,620,238 B2 | 4/2017 | Khandelwal et al. |
| 9,640,274 B1 | 5/2017 | Kondo |
| 9,761,318 B1 | 9/2017 | Kondo |
| 10,014,063 B2 | 7/2018 | Tseng et al. |
| 2013/0077409 A1 | 3/2013 | Shiino et al. |
| 2014/0119126 A1 * | 5/2014 | Dutta ................. G11C 11/5628 365/185.19 |
| 2016/0099070 A1 * | 4/2016 | Jiang ..................... G11C 16/26 365/185.21 |
| 2017/0011799 A1 * | 1/2017 | Lee ....................... G11C 16/10 |

\* cited by examiner

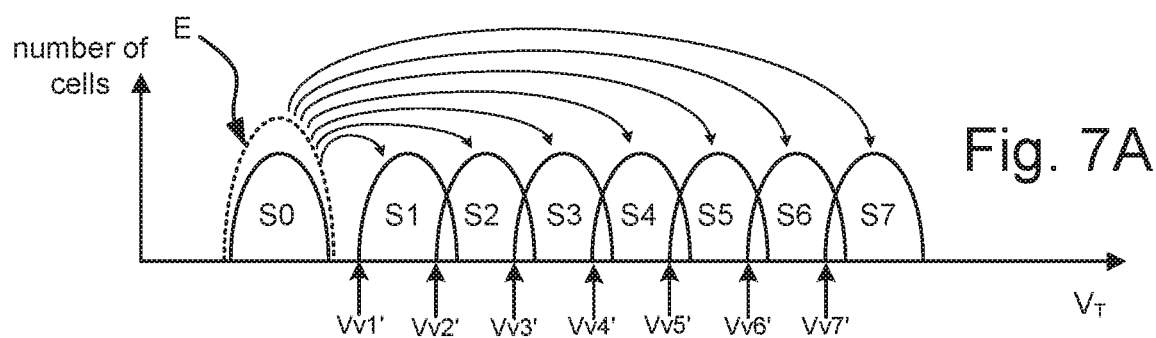
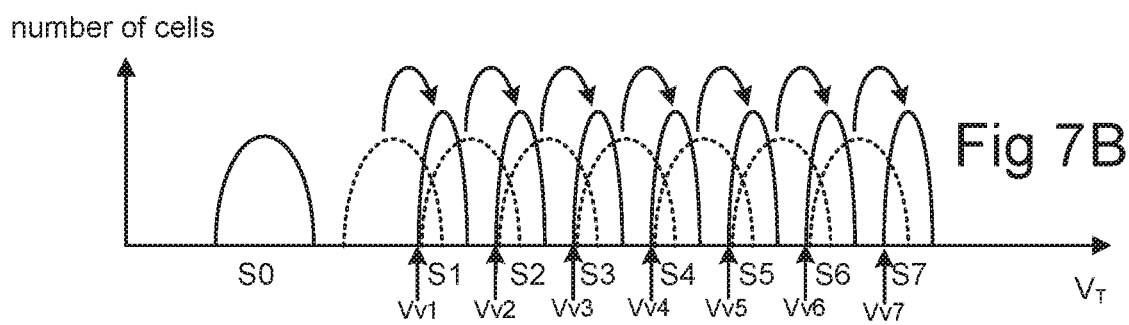

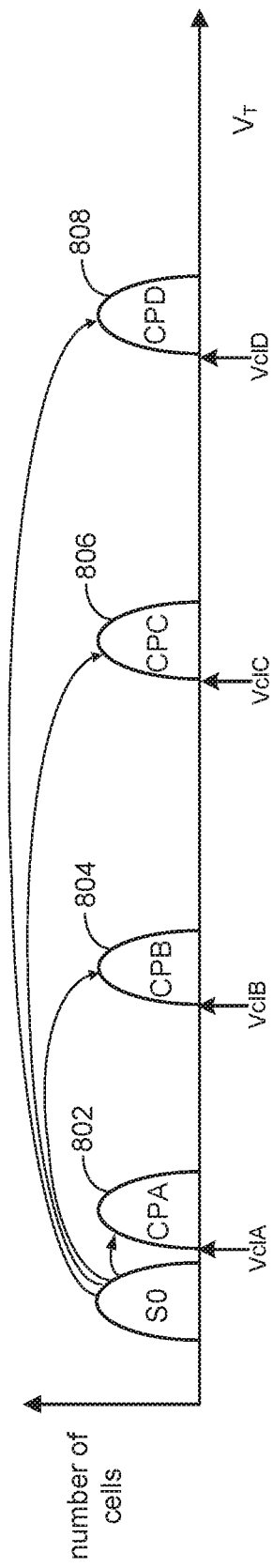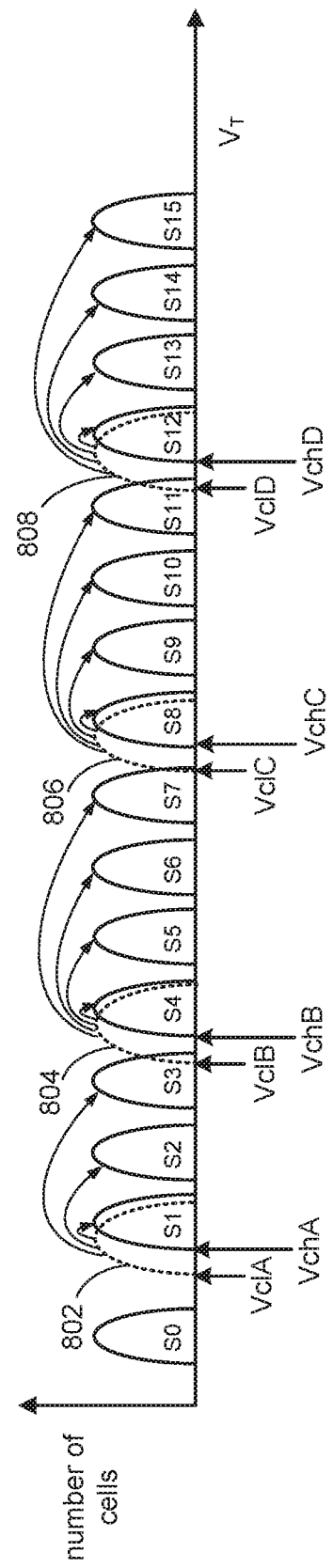

1300

| Apply state dependent number of program pulses with full program enable (no verify) | — 1302 |

| | Vt > VH | | | |
|---|---|---|---|---|
| | P1 | P2 | P3 | P4 |
| CP +1 | full | inhibit | inhibit | inhibit |
| CP +2 | full | full | inhibit | inhibit |
| CP +3 | full | full | full | inhibit |

Fig. 13B

| 1450 | | | | |
|---|---|---|---|---|
| | VL < Vt < VH | | | |
| | P1 | P2 | P3 | P4 |
| CP +1 | PE_max -Δ | PE_max | inhibit | inhibit |
| CP +2 | PE_max -2Δ | PE_max-Δ | PE_max | inhibit |
| CP +3 | PE_max -3Δ | PE_max-2Δ | PE_max-Δ | PE_max |

| | Vt > VH | | | |
|---|---|---|---|---|
| | P1 | P2 | P3 | P4 |
| CP +1 | PE_max -β | PE_max | inhibit | inhibit |
| CP +2 | PE_max -2β | PE_max-β | PE_max | inhibit |
| CP +3 | PE_max -3β | PE_max-2β | PE_max-β | PE_max |

| | Vt > VH | | | |
|---|---|---|---|---|
| | P1 | P2 | P3 | P4 |
| CP +1 | PE_max - γ | PE_max - γ | inhibit | inhibit |
| CP +2 | PE_max -2γ | PE_max -2γ | PE_max -2γ | inhibit |
| CP +3 | PE_max -3γ | PE_max -3γ | PE_max -3γ | PE_max -3γ |

1750

| | VL < Vt < VH | | | |
|---|---|---|---|---|
| | P1 | P2 | P3 | P4 |
| CP +1 | PE_max | PE_max - Δ | inhibit | inhibit |
| CP +2 | PE_max | PE_max - Δ | PE_max-2Δ | inhibit |
| CP +3 | PE_max | PE_max- Δ | PE_max-2Δ | PE_max-3Δ |

| | VL < Vt < VH | | | |
|---|---|---|---|---|
| | P1 | P2 | P3 | P4 |
| CP +1 | t_max - τ | t_max | inhibit | inhibit |
| CP +2 | t_max - 2τ | t_max - τ | t_max | inhibit |
| CP +3 | t_max - 3τ | t_max - 2τ | t_max - τ | t_max |

US 10,748,622 B2

STATE ADAPTIVE PREDICTIVE PROGRAMMING

CLAIM OF PRIORITY

The present application claims priority from U.S. Provisional Patent Application No. 62/794,977, entitled "STATE ADAPTIVE REDUCED VERIFY," by Lin et al., filed Jan. 21, 2019, incorporated by reference herein in its entirety.

BACKGROUND

The present technology relates to the operation of memory devices.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

FIGS. 7A and 7B described one example of a multi-pass programming process, referred to as Foggy-Fine Programming.

FIGS. 8A and 8B depict one embodiment in which a reduced number of verifies are used during a program operation.

FIG. 13A is a flowchart of one embodiment of a process of predictive programming.

FIG. 13B shows a table of voltages that may be applied to bit lines during one embodiment of the process of FIG. 13A.

DETAILED DESCRIPTION

Figure 1:
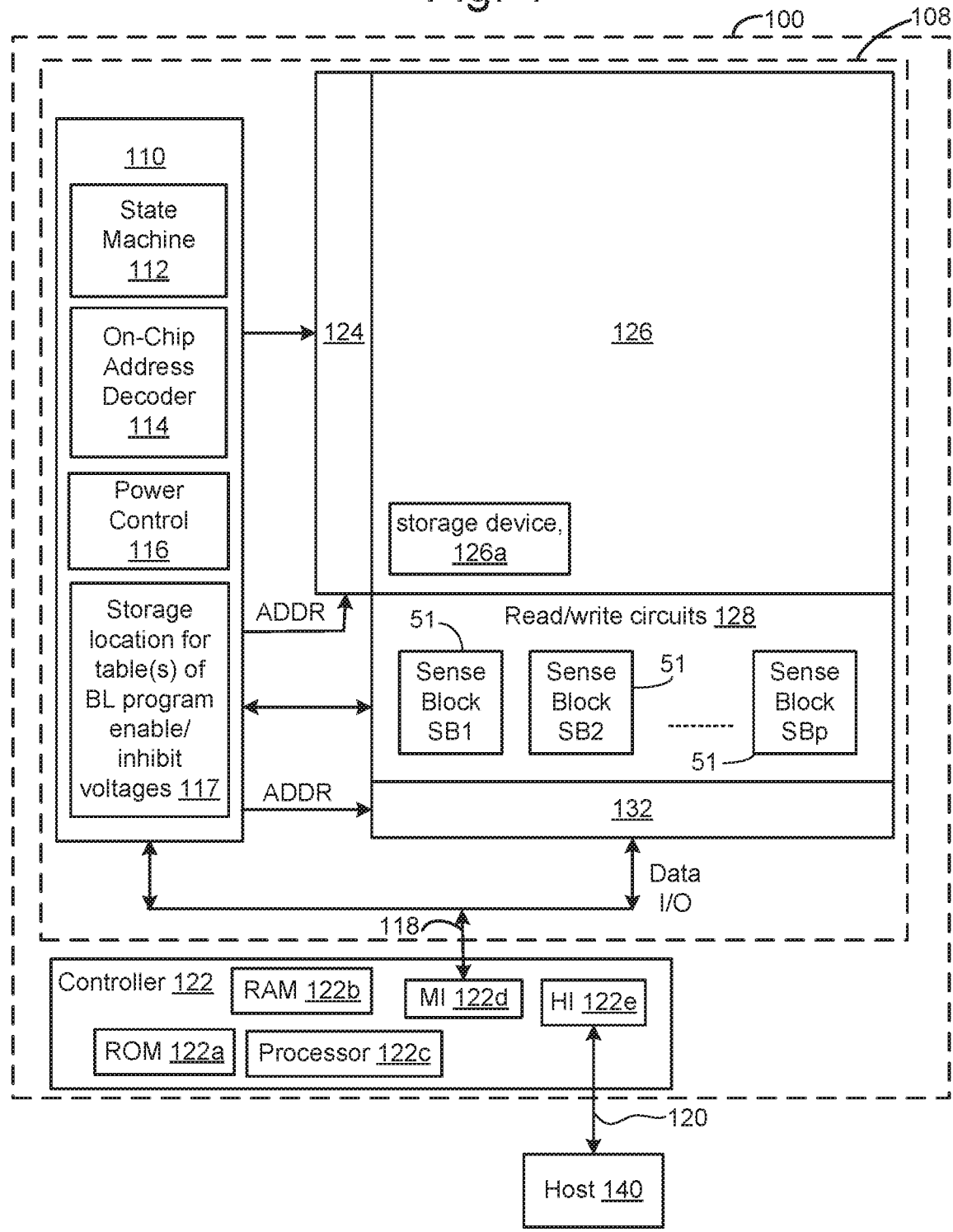
FIG. 1 is a functional block diagram of a memory device.

Techniques are provided for predictive programming during program of non-volatile memory. Predictive programming, as the term is used herein, refers to applying one or more program pulses to a memory cell without verifying that the memory cell has reached a target state. Some memory cells undergo predictive programming after the memory cell's threshold voltage (Vt) has been verified as having reached a checkpoint state ("CP-state"). Such memory cells are referred to herein as "non-CP memory cells." Such a non-CP memory cell receives one or more additional program pulses to program the memory cell to its target state without verifying that memory cell has reached its target state. The predictive programming may reduce the number or program verify operations, which reduced programming time. The non-volatile memory is NAND memory, in one embodiment. In one embodiment, the NAND memory is in a Bit-Cost-Scalable (BiCs) architecture.

A problem with some techniques for programing memory such as NAND is that programming speed is sacrificed in order to obtain tight threshold voltage distributions. A problem with some techniques for programing memory such as NAND is that tight threshold voltage distributions are sacrificed in order to obtain programming speed.

Embodiments of state adaptive predictive programming may obtain a wide Vt margin (e.g., voltage gap between Vt distributions). In other words, embodiments of state adaptive predictive programming obtain tight threshold voltage distributions. Embodiments of adaptive predictive programming have a high programming speed. Moreover, embodiments of adaptive predictive programming have a wide Vt margin and a high programming speed. In other words, embodiments of state adaptive predictive programming obtain tight threshold voltage distributions without sacrificing programming speed.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The layers may be arranged concentrically. Each NAND string may have the shape of a pillar which intersects with the word lines to form the memory cells.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state (also referred to as S0) and three higher data states referred to as either the A, B and C data states (also referred to as S1, S2, and S3). In a three-bit per cell memory device, there are eight data states including the erased state (S0) and seven higher data states referred to as the A-G data states (also referred to as S1, S2, S3, S4, S5, S6, and S7). In a four-bit per cell memory device, there are sixteen data states including the erased state (S0) and fifteen higher data states, S0-S15.

A program operation may use a set of increasing program voltages or pulses which are applied to the word line in respective program loops or program-verify iterations in one or more program passes. Verify tests may be performed after at least some of the program voltages to determine whether the memory cells have completed programming (or reached a checkpoint). However, the verify test can slow programming. Thus, in some embodiments, programming is accomplished with a reduced number of program verify operations.

A verify test can involve applying a verify voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vt of the memory cell exceeds the control gate voltage and the memory cell has reached the assigned data state. Programming is thus completed for the memory cell, and it can be locked out from further programming while programming continues for other memory cells in subsequent program loops.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vt of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

FIG. 1-FIG. 4D describe one example of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The read/write/erase circuits 128 include multiple sense blocks 51 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase and others) on memory structure 126, and includes state machine 112, an on-chip address decoder 114, a power control circuit 116, and a storage location for one or more tables of bit line (BL) program enable/inhibit voltages 117. In one embodiment the table(s) of bit line (BL) program enable/inhibit voltages 117 is used during state adaptive predictive programming. Tables 117 may store one or more of table 1250 (FIG. 12B), table 1350 (FIG. 13B), table 1450 (FIG. 14B), table 1550 (FIG. 15B), table 1650 (FIG. 16B), table 1750 (FIG. 17B), table 1850 (FIG. 18B), table 2150 (FIG. 21B), and/or table 2250 (FIG. 22B). In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered one or more control circuits that perform the functions described herein. The one or more control circuits can include hardware only or a combination of hardware and software (including firmware). For example, a controller programmed by firmware to perform the functions described herein is one example of a control circuit. One or more control circuits can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

Figure 2:
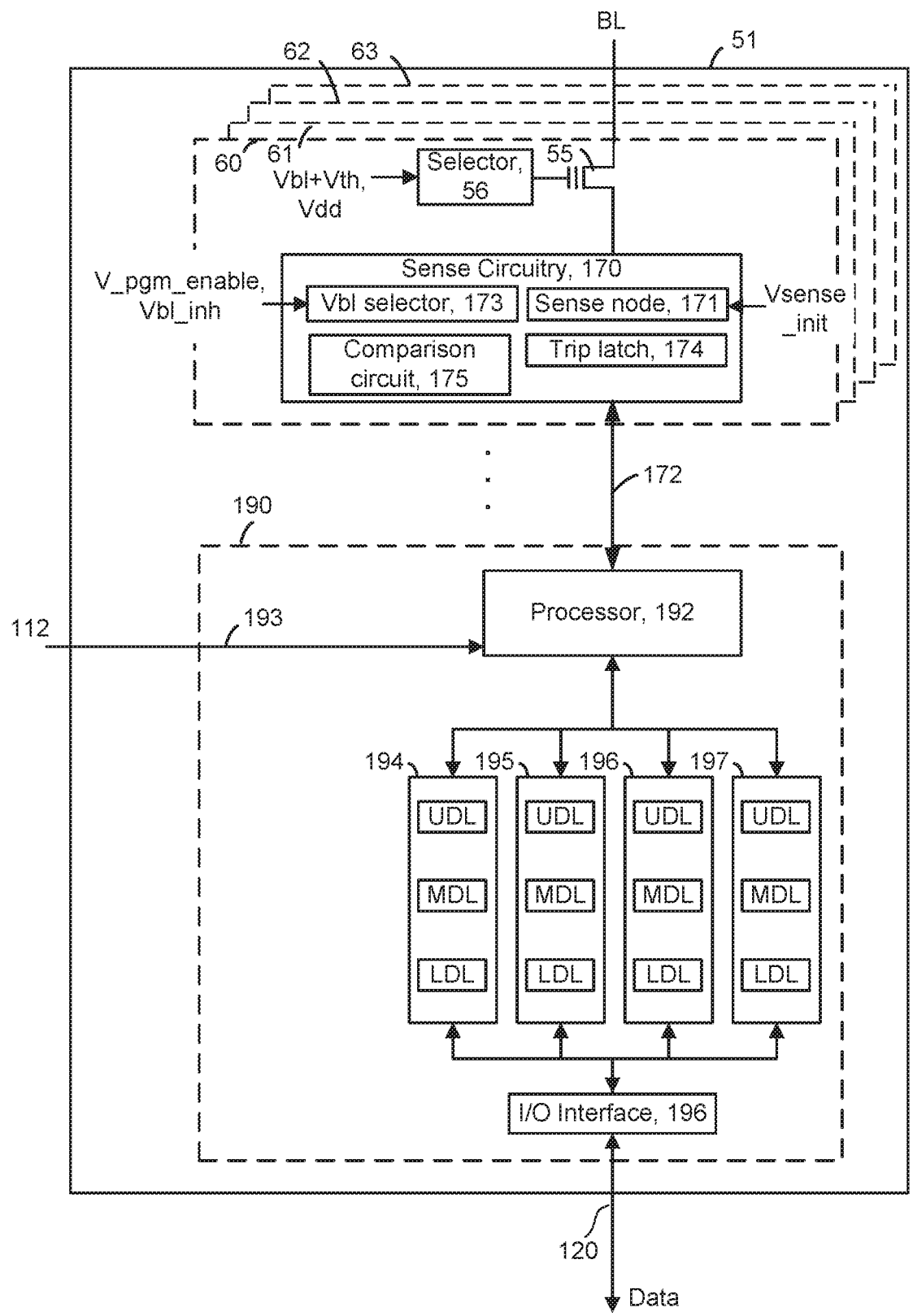
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program enable voltage (e.g., V_pgm_enable) or a program-inhibit voltage (e.g., Vbl_inh) to a bit line connected to a memory cell. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line.

A program enable voltage may have a range of voltages. For example, a program enable voltage applied to a bit line could range from 0V to 1V. An example of a program-inhibit voltage applied to a bit line is 2V. In some embodiments, the Vbl selector 173 may apply different magnitudes of program enable voltage to a bit line coupled to the memory cell. For example, certain program pulses applied to the memory cell may include a full program enable voltage (which has the lowest magnitude) applied to a bit line while another program pulse may include a higher magnitude ("weak") program enable voltage applied to the bit line which results in the memory cell experiencing a reduced influence from a program pulse. In some embodiments, the magnitude of the program enable voltage depends on the state being predictively programmed. In one embodiment, the magnitude of the program enable voltage depends on the non-check point (non-CP) state being programmed. Non-CP states will be discussed below.

During programming, a program voltage is applied to the control gate of a memory cell. The voltage between the control gate and memory cell channel impacts programming strength. A larger voltage results in stronger programming, in one embodiment. In one embodiment, the program enable voltage (e.g., V_pgm_enable) is described herein as either a "full program enable voltage" or a "weak program enable voltage," depending on its magnitude. A full program enable voltage for a program process refers to the magnitude that results in the strongest programming level for a given program voltage applied to the memory cell. In one embodiment, the full program enable voltage is the smallest magnitude program enable voltage used in the program process. In one embodiment, the full program enable voltage is 0V. The weak program enable voltage could have more than one magnitude during a programming process. For example, the weak program enable voltage might be greater than 0V but less than or equal to 1V for one set of program pulses and of a different magnitude to other programming pulses in the same programming process. In one embodiment, the magnitude of the weak program enable voltage depends on the state to which the memory cell is being programmed.

A weak program enable voltage results in weaker programming than the full program enable voltage for the same program voltage applied to, for example, the control gate of the memory cell. Weak programming means that the memory cell will program, but the memory cell's state (e.g., threshold voltage) will not be changed (e.g., increased) by as much compared to full programming. In some embodiments, when a program enable voltage (full or weak) is applied to the bit line, the bit line is connected to the channel of the NAND string having the memory cell selected for programming. Moreover, the program enable voltage may be passed to the NAND channel. The strength of programming is a function of the difference between the program voltage (e.g., Vpgm) applied to the memory cell's control gate and the program enable voltage applied to the bit line coupled to the memory cell, in one embodiment. In one embodiment, a weak program enable voltage applied to the bit line increases the potential of the NAND string channel (and hence memory cell channel) slightly relative to a full program enable voltage applied to the bit line. Therefore, the weak program enable voltage results in weaker programming than the full program enable voltage.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

In one embodiment, the magnitude of the full program enable voltage is 0V, but the magnitude of the full program enable voltage may depend on the programming process. When a programming process applies two or more different magnitude program enable voltages to bit lines, by definition herein, the full program enable voltage is the one that allows for the strongest programming for a given program voltage applied to the selected word line. Stated another way, the full program enable voltage results in the largest voltage between the control gate and channel of the memory cell.

The strength (or impact) of an individual program enable voltage may depend on factors including but not limited to the magnitude of the program enable voltage, and the time for which the program enable voltage is applied (in combination with a program voltage). The strength (or impact) of an individual program enable voltage depends on the magnitude of the program enable voltage, in one embodiment. A lower magnitude program enable voltage corresponds to a stronger program enable, in one embodiment. The strength of an individual program enable voltage depends on the amount of time for which the program enable voltage is applied to a bit line (in combination with a program voltage applied to the memory cell), in one embodiment. Applying the program enable voltage to the bit line for a longer time (in combination with a program voltage) increases the impact of the program enable voltage, in one embodiment. In some embodiments, the embodiment changes the magnitude of the program enable voltage while the program voltage is applied to the memory cell. For example, the program enable voltage can change from a full program enable voltage to a weak program enable voltage. The impact of an individual program enable voltage depends on the relative amount of time for which the full program enable and weak program enable voltages are applied to the bit line, in one embodiment. For example, lengthening the time for the full program enable voltage while shortening the time for the weak program enable voltage increases the impact of the program enable voltage, in one embodiment. The impact of an individual program enable voltage depends on the average magnitude of the program enable voltage (while a program voltage is applied to the memory cell), in one embodiment. For example, increasing the average magnitude of the individual program enable voltage decreases the impact of the program enable voltage, in one embodiment.

In some embodiments, the program enable voltages during predictive programming have a state dependent average magnitude. The number of program pulses during predictive programming, and hence the number of program enable voltages, depends on the target state, in some embodiments. For each target state there is a pre-determined set of program enable voltages, in one embodiment. By state dependent average magnitude it is meant that the average magnitude of the program enable voltages in the set depends on the target state. Using state dependent average magnitudes of program enable voltages helps to obtain a wide Vt margin without sacrificing programming speed.

In some embodiments, a weak program enable voltage may be referred to herein as a "quick pass write" or QPW voltage. QPW programming may be used to slow programming as the memory cells approach their target value. After each programming pulse, the memory is verified at a first, lower verify value, followed by a second verify at a second higher level. When the memory cell's Vt is between the lower and higher verify level, the bit line biasing of the selected memory cell is altered (e.g., increased) to slow programming. After the memory cell passes the higher verify level, the cells is locked out from further programming. The first, lower verify level is used to change the programming phase. More information about QPW is described in U.S. Pat. No. 8,705,293, titled "Compact Sense Amplifier for Non-Volatile Memory Suitable for Quick Pass Write;" and U.S. Pat. No. 7,345,928, titled "Data Recovery Methods in Multi-state Memory after Program Fail;" both of which are incorporated herein by reference in their entirety.

A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

The sense circuit 60 is configured to control the timing of when the voltages are applied to the bit line. The sense circuit 60 is configured to control the length of time that the QPW voltage is applied to the bit line, in one embodiment. In one embodiment, the length of time that a weak program enable voltage is applied to the BL during predictive programming depends on the non-CP state (to which the memory cell associated with the BL is being programmed). In one embodiment, the lengths of time that both a full program enable and a weak program enable voltage are applied to the BL during predictive programming depends on the non-CP state (to which the memory cell associated with the BL is being programmed).

During sensing operations such as read and verify operations, the bit line voltage is set by the transistor 55 based on the voltage passed by the selector 56. The bit line voltage is roughly equal to the control gate voltage of the transistor minus its Vt (e.g., 1 V). For example, if Vbl+Vt is passed by the selector 56, the bit line voltage will be Vbl. This assumes the source line is at 0 V. The transistor 55 clamps the bit line voltage according to the control gate voltage and acts as a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a middle page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

The processor 192 may also be used to determine what voltage to apply to the bit line, based on the state of the latches. This may be used to manage the magnitude and/or length of time that a weak program enable voltage is applied to the bit line.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

In one embodiment, the latches are used to store information for how many additional program pulses a memory cell is to receive during a reduced verify program operation. For example, the latches may indicate how many additional program pulses that the memory cell is to receive without a verify following the program pulse.

Figure 3:
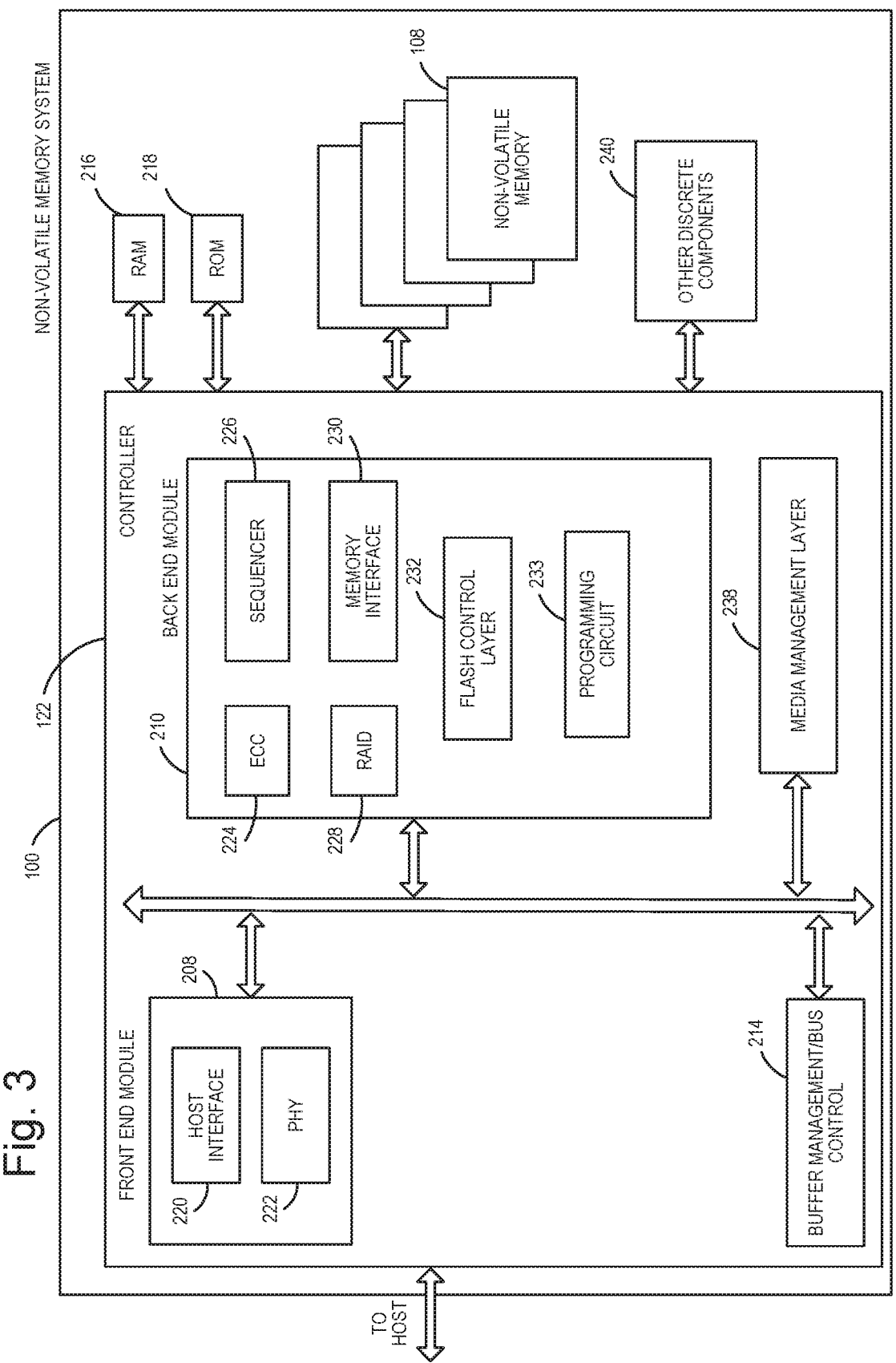
FIG. 3 is a block diagram depicting one embodiment of a memory system.

FIG. 3 is a block diagram of example memory system 100, depicting more details of one embodiment of controller 122. The controller in FIG. 3 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

The memory cells on a memory die 108 can be arranged in one or more planes. In one embodiment, memory operations are performed in parallel on groups of memory cells on different planes on the same memory die. In one embodiment, threshold voltage maintenance of non-data transistors (e.g., select transistors and/or dummy memory cell transistors) is performed in parallel on different planes on the same memory die. In one embodiment, memory operations are performed in parallel on groups of memory cells on different memory die 108. In one embodiment, threshold voltage maintenance of non-data transistors (e.g., select transistors and/or dummy memory cell transistors) is performed in parallel on different memory die.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 108 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230, which is configured to be connected to non-volatile memory 108, provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

The programming circuit 233 is configured to control programming of memory cells in non-volatile memory 108. The programming circuit 233 performs predictive programming, in one embodiment. The programming circuit 233 may be configured to implement any of processes 1000, 1100, 1200, 1300, 1400, 1500, 1600, 1700, 1800, 2100, and/or 2200.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

One or more of ECC 224, sequencer 226, RAID 228, flash control layer 232, media management layer 238, and/or buffer management/bus control 214 may be referred to as a processor circuit. The processor circuit can include hardware only or a combination of hardware and software (including firmware). For example, a controller programmed by firmware to perform the functions described herein is one example of a control circuit. A processor circuit can include a processor, PGA (Programmable Gate Array, FPGA (Field Programmable Gate Array), ASIC (Application Specific Integrated Circuit), integrated circuit or other type of circuit.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 4:
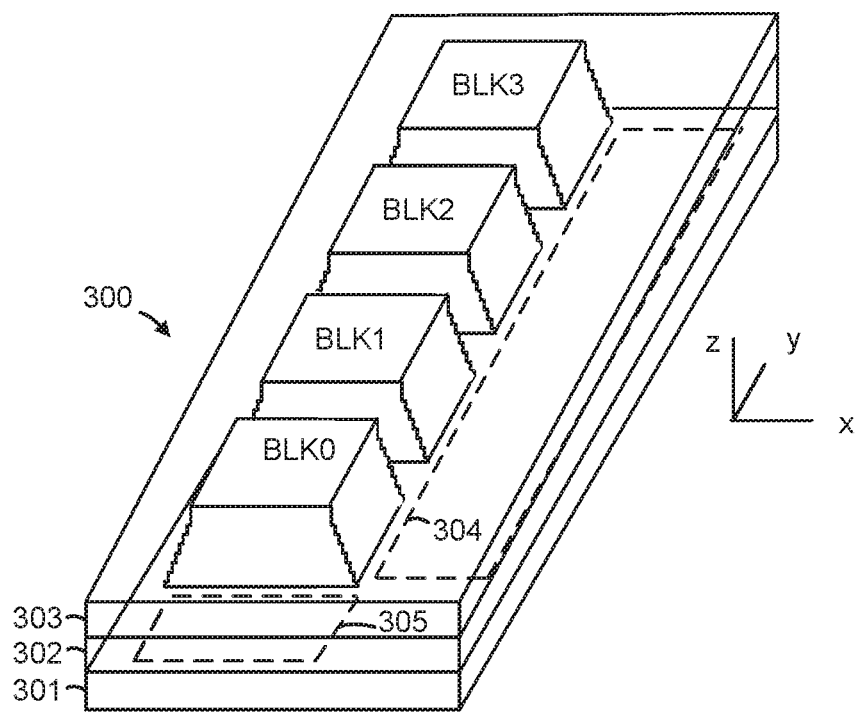
FIG. 4 is a perspective view of a memory device.

FIG. 4 is a perspective view of a memory device 300 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4A:
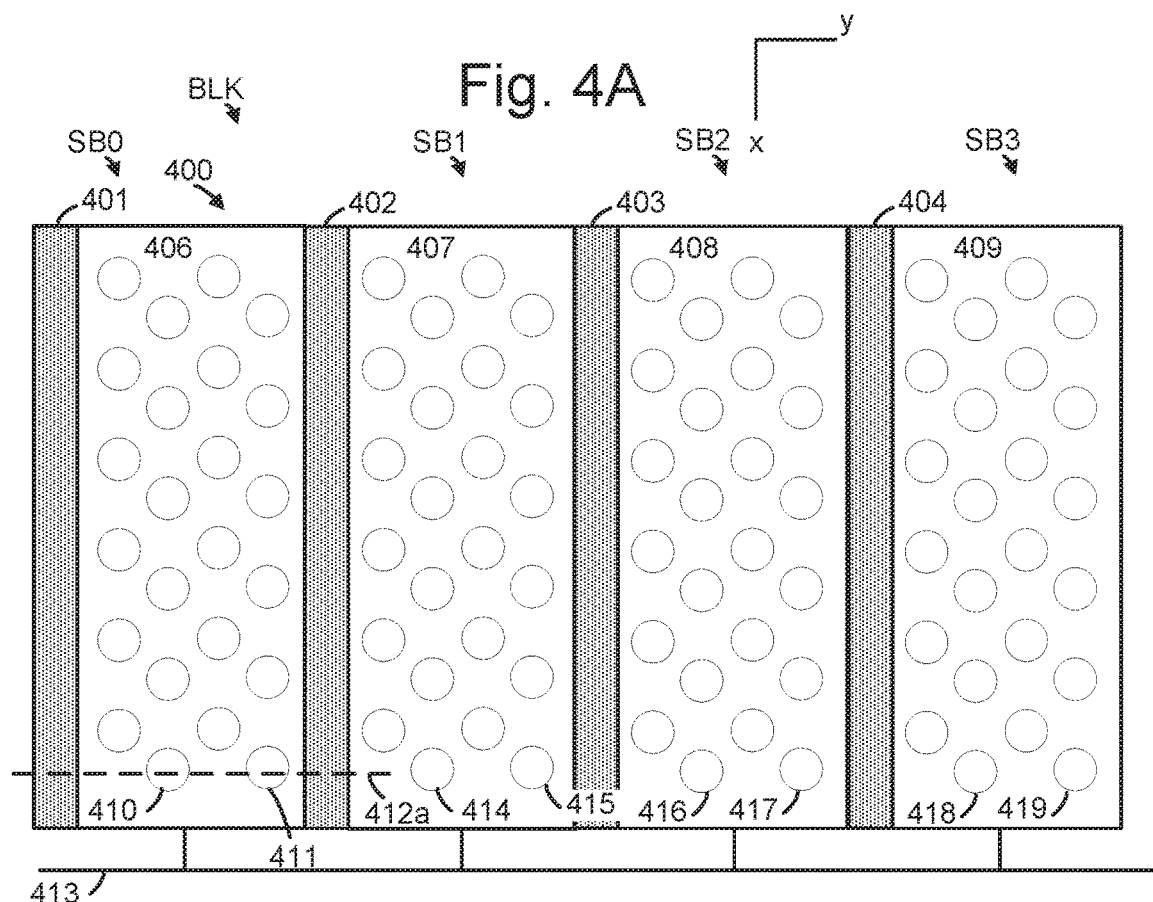
FIG. 4A depicts a top view of an example word line layer of a 3D memory structure, in a straight NAND string embodiment.

FIG. 4A depicts a top view of an example word line layer 400 of a 3D memory structure, in one embodiment. A 3D memory device can comprise a stack of alternating conductive and dielectric layers. Herein, the layers may be referred to as horizontal layers, due to their orientation with respect to the x-y surface of the substrate 301. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

FIG. 4A and other Figures are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412a. The region 407 has example memory holes 414 and 415. The region 408 has example memory holes 416 and 417. The region 409 has example memory holes 418 and 419.

Each circle represents the cross-section of a memory hole at a word line layer or SG layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

Figure 4B:
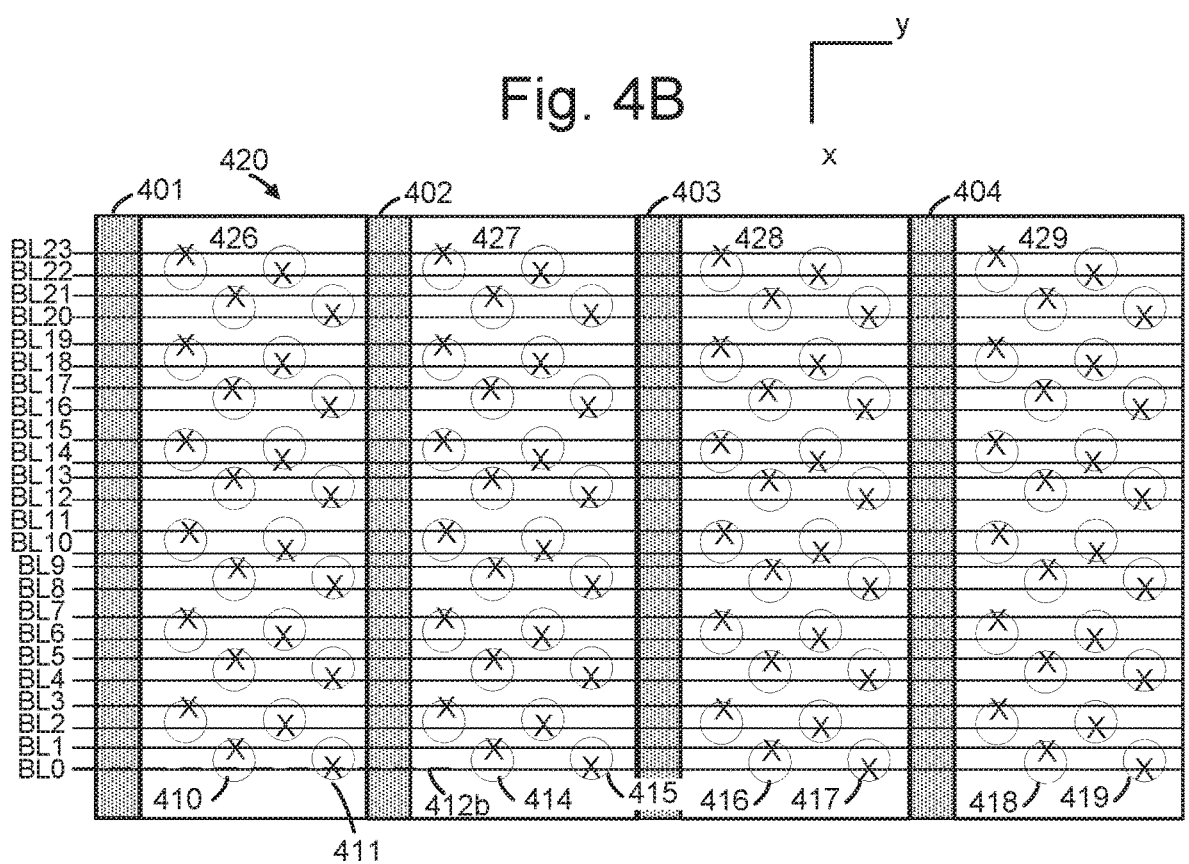
FIG. 4B depicts a top view of an example SGD layer 420, consistent with FIG. 4A.

FIG. 4B depicts a top view of an example SGD layer 420, consistent with FIG. 4A. The SGD layer is divided into regions 426, 427, 428 and 429. Each region can be connected to a different voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412b which is coincident with a bit line BL0. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the x-direction. In practice many more bit lines can be used for SGD layer 420.

Different subsets of bit lines are connected to cells in different rows. For example, BL0, BL4, BL8, BL12, BL16 and BL20 are connected to cells in a first row of cells at the right-hand edge of each region. BL2, BL6, BL10, BL14, BL18 and BL22 are connected to cells in an adjacent row of cells, adjacent to the first row at the right-hand edge. BL3, BL7, BL11, BL15, BL19 and BL23 are connected to cells in a first row of cells at the left-hand edge of each region. BL1, BL5, BL9, BL13, BL17 and BL21 are connected to cells in an adjacent row of cells, adjacent to the first row at the left-hand edge.

Figure 4C:
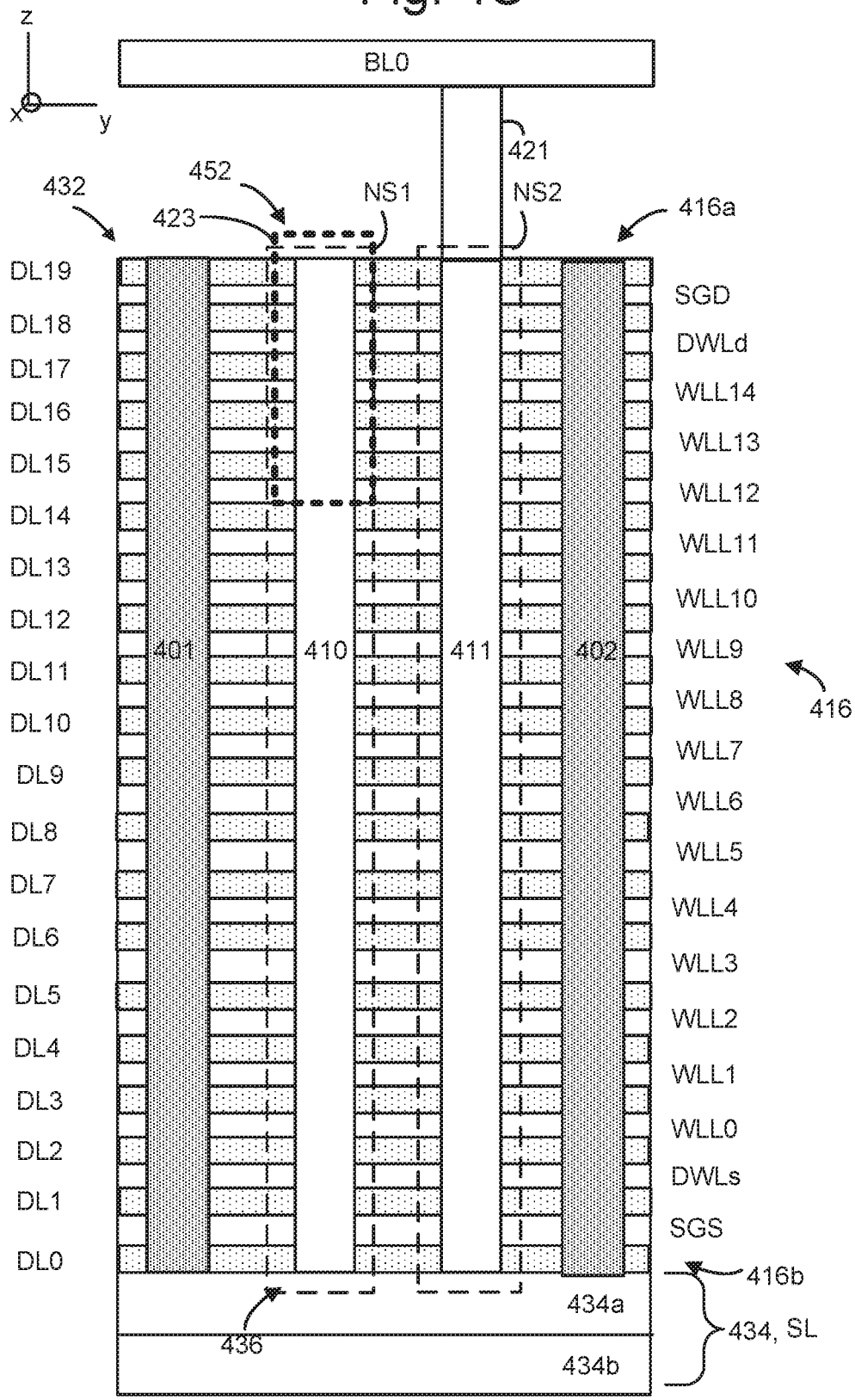
FIG. 4C depicts an example cross-sectional view of a portion of one of the blocks of FIG. 4.

FIG. 4C depicts an example cross-sectional view of a portion of one of the blocks of FIG. 4. The block comprises a stack 432 of alternating conductive and dielectric layers. In this example, the conductive layers comprise SGD layer, SGS layers, dummy word line layers (or word lines) DWLd, DWLs, in addition to data word line layers (or word lines) WLL0-WLL14. The dielectric layers are labelled as DL0-DL19. Further, regions of the stack which comprise NAND strings NS1 and NS2 are depicted. Each NAND string encompasses a memory hole 410 or 411 which is filled with materials which form memory cells adjacent to the word lines. A region 423 of the stack is shown in greater detail in FIG. 4D. Note that there may be more or fewer SGD layers, SGS layers, dummy word line layers, and data word line layers.

Underneath the stack is a source line (SL) 434. In one approach, a portion of the source line SL comprises a polysilicon layer 434a which is in contact with a source end of each string of memory cells in a block. The polysilicon layer 434a is in electrical contact with the NAND string channel (not shown in FIG. 4C). The polysilicon layer 434a is in contact with a metal 434b (e.g., tungsten) layer. The source line 434 may be shared by all of the blocks in a plane, in one approach.

NS1 has a source-end 436 at a bottom 416b of the stack 432 and a drain-end 452 at a top 416a of the stack. Metal-filled slits 401, 402 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 421 connects the drain-end 452 of NS2 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

Figure 4D:
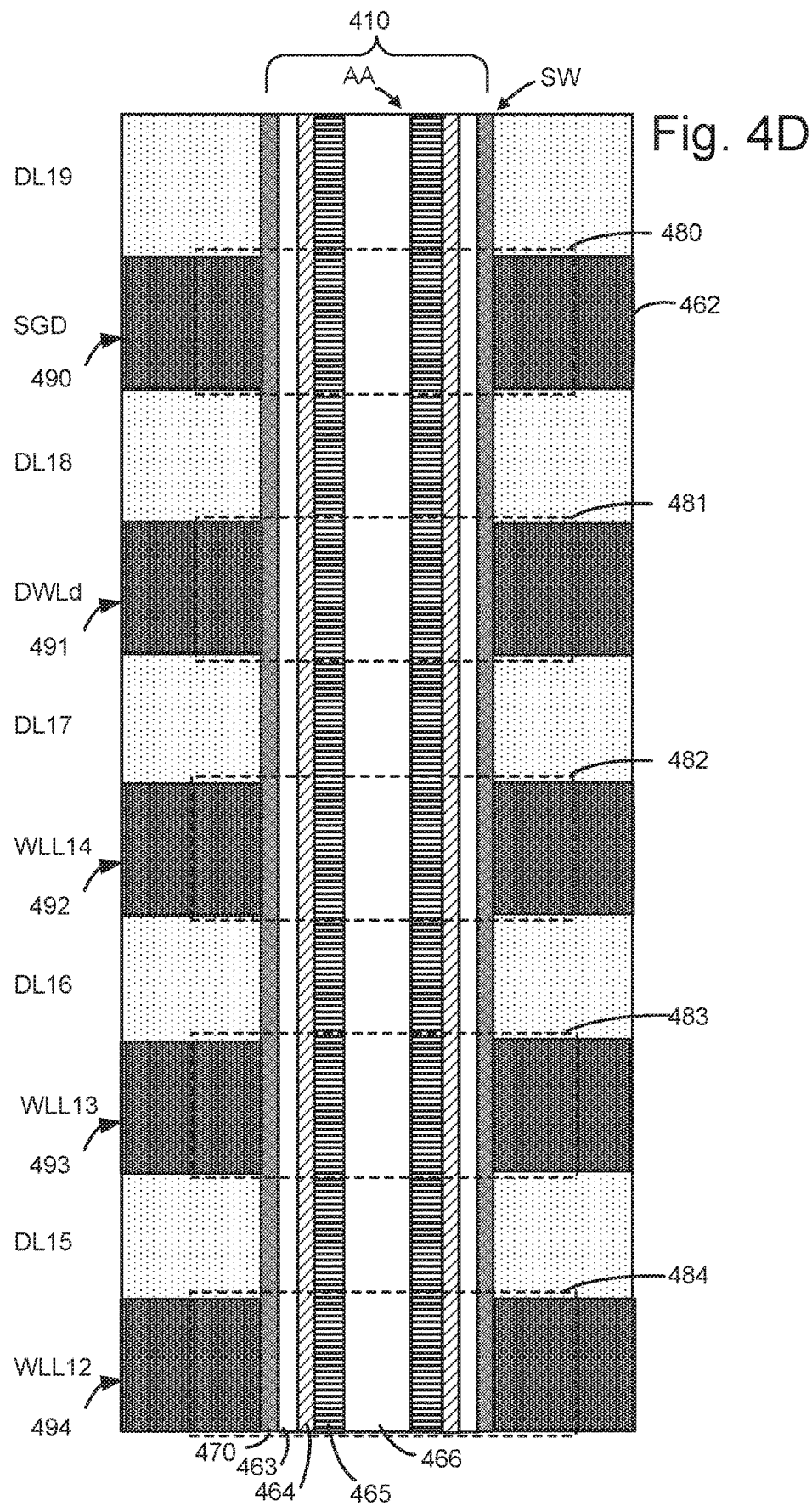
FIG. 4D depicts a view of the region 423 of FIG. 4C.

FIG. 4D depicts a view of the region 423 of FIG. 4C. SGD transistor 480 is provided above dummy memory cell transistor 481 and a data memory cell transistors 482-484. A number of layers can be deposited along the sidewall (SW) of the memory hole 410 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Non-data transistors (e.g., select transistors, dummy memory cell transistors) may also include the charge trapping layer 463. In FIG. 4D, select transistor 480, and dummy memory cell transistor 481 include the charge trapping layer 463. Thus, the threshold voltage of at least some non-data transistors may also be adjusted by storing or removing electrons from the charge trapping layer 463. It is not required that all non-data transistors have an adjustable Vt. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Figure 5:
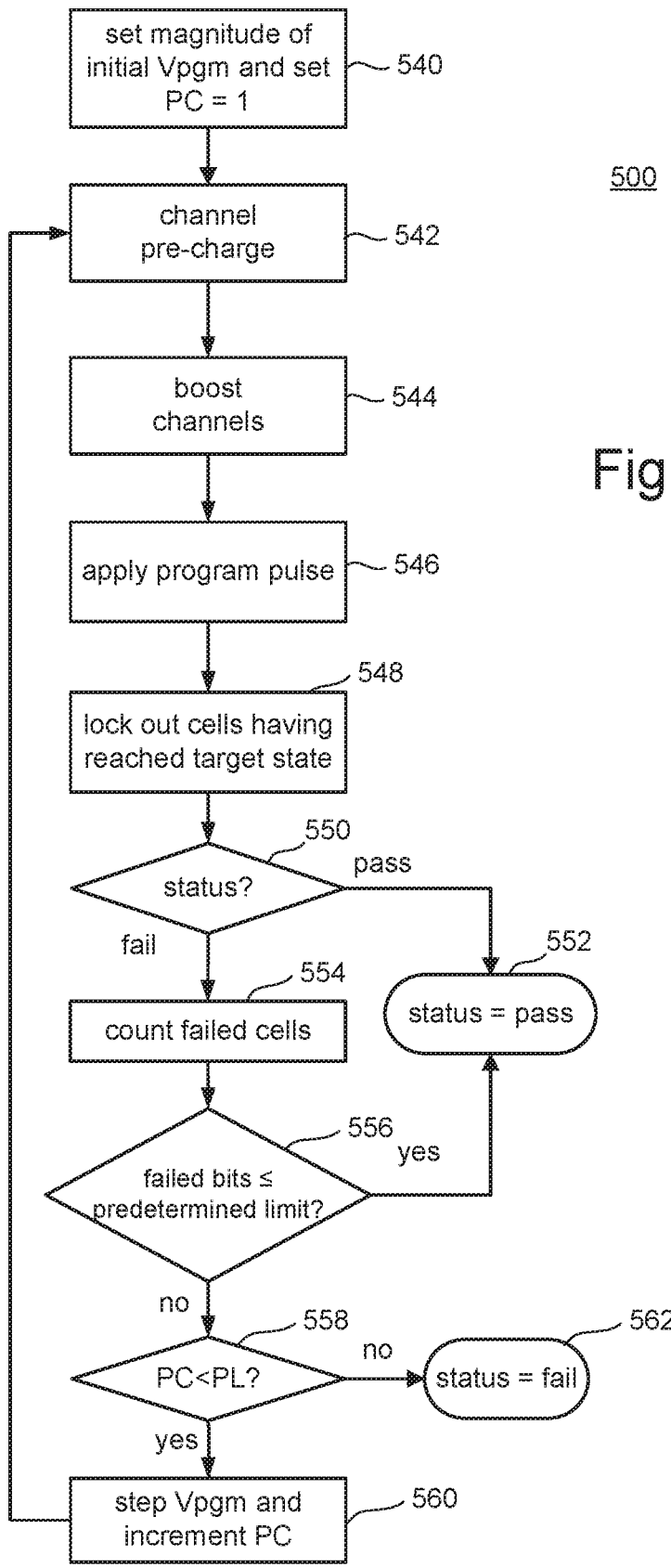
FIG. 5 is a flowchart describing one embodiment of a process 500 for programming NAND strings of memory cells organized into an array.

FIG. 5 is a flowchart describing one embodiment of a process 500 for programming NAND strings of memory cells organized into an array. In one example embodiment, the process of FIG. 5 is performed on memory die 108 using the control circuit discussed above. For example, the process of FIG. 5 can be performed at the direction of state machine 112. FIG. 5 is used to perform predictive programming of memory cells, in one embodiment.

Typically, the program voltage applied to the control gates (via a selected word line) during a program operation is applied as a series of program pulses. Between at least some of the programming pulses are a set of verify pulses to perform verification. Not all states are verified after a program pulse, in some embodiments. In many implementations, the magnitude of the program pulses is increased with each successive pulse by a predetermined step size. In step 540 of FIG. 5, the programming voltage (Vpgm) is initialized to the starting magnitude (e.g., ~12-16V or another suitable level) and a program counter PC maintained by state machine 112 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 (see FIG. 6) so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 542 the memory system will pre-charge channels of NAND strings that include memory cells connected to the selected word line that are to be inhibited from programming. In some embodiments, the channel is pre-charged from the drain end of the NAND string. By "drain end" it is meant the end of the NAND string connected to the bit line. In some embodiments, the channel is pre-charged from the source end. By "source end" it is meant the end of the NAND string connected to the source line. In some embodiments, the channel is pre-charged from both the drain end and the source end.

In step 544, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string. The SGD transistor 480 will be off as a result of the program inhibit voltage and a voltage applied to the control gate of the SGD transistor 480, in one embodiment. Because the SGD transistor 480 is off, the channel of an unselected NAND string is cut off from its bit line. This allows the boosting voltages to boost the potential of the NAND channel.

In step 546, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string." The SGD transistor 480 will be on as a result of the program enable voltage and a voltage applied to the control gate of the SGD transistor 480, in one embodiment. Because the SGD transistor 480 is on, the channel of a selected NAND string will be connected to its bit line. This allows the program enable voltage to pass to the NAND channel, in one embodiment.

The magnitude of the program enable voltage can change for different loops of process 500. For example, the bit line might be biased at a "full program enable voltage" (e.g., 0V) for some program loops, and a "weak program enable voltage" for other program loops. For example, the weak program enable voltage might be greater than 0V, but less than or equal to 1V. The magnitude of the weak program enable voltage can change for different program loops. In some embodiments, the magnitude of the program enable voltage depends on the target state of the memory cell. On the other hand, if the memory cell should remain at its current threshold voltage, then the corresponding bit line is biased at a program inhibit voltage (e.g., Vdd or about 2V) to inhibit programming, in one embodiment.

In step 546, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 548, memory cells that have reached their target states are locked out from further programming. Step 548 may include performing verifying at one or more verify reference levels. In one embodiment, the verification process is performed by testing whether the threshold voltages of the memory cells selected for programming have reached the appropriate verify reference voltage. The verify reference voltage is at a lower tail of the target state, in one embodiment. As used herein "lower tail" refers to a portion of distribution between its lowest threshold voltage level and the threshold voltage level at the apex of the distribution. Similarly, as used herein "upper tail" refers to a portion of distribution between its highest threshold voltage level and the threshold voltage level at the apex of the distribution. The verify reference voltage is at a lower tail of a checkpoint state, in one embodiment. As will be discussed below, verification is not performed for all of the target states in some embodiments. Thus, a reduced number of verify tests are performed in some embodiments.

In step 548, a memory cell may be locked out after the memory cell has been verified (by a test of the Vt) that the memory cell has reached its target state. Such memory cells are referred to as checkpoint memory cells or CP memory cells, in one embodiment. Some memory cells undergo predictive programming after the memory cell's Vt has been verified as having reached a checkpoint state. Such memory cells are referred to herein as non-checkpoint memory cells or "non-CP memory cells." Such non-CP memory cells receive one or more additional program pulses without verifying the Vt of that memory cell. After performing the one or more additional program pulses, the non-CP memory cell is locked out from further programming (without a further check of the memory cell's Vt). In other words, after the one or more additional program pulses it is assumed that the non-CP memory cell has reached its target state. Hence, programming time is improved as the total number of verify operations is reduced. During step 546, the magnitude of the program enable voltage applied to the bit lines of such non-checkpoint memory cells depends on the state to which the non-checkpoint memory cells are being programmed, in one embodiment.

If, in 550, it is determined that all of the memory cells have reached their target threshold voltages (pass), the programming process is complete and successful because all selected memory cells were programmed and verified to their target states. A status of "PASS" is reported in step 552. Otherwise if, in 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed to reach their target state. This counting can be done by the state machine, the controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state. In step 554, the memory system also determines whether the non-checkpoint memory cells have completed programming. In one embodiment, a non-checkpoint memory cells is considered to have reached its target threshold voltage distribution after it has received a pre-determined number of program pulses after reaching the checkpoint for that memory cell. The pre-determined number of program pulses are stored in latches 194-197, in one embodiment.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 558 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 560, the process loops back to step 542 and another program pulse is applied to the selected word line so that another iteration (steps 542-560) of the programming process of FIG. 5 is performed.

Figure 6:
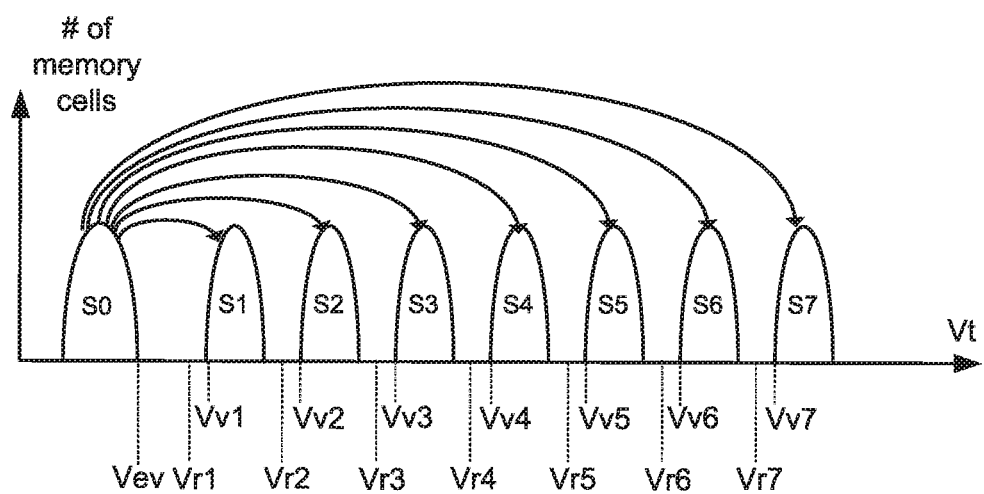
FIG. 6 shows seven read reference voltages, Vr1, Vr2, Vr3, Vr4, Vr5, Vr6, and Vr7 for reading data from memory cells.

At the end of a successful programming process, the threshold voltages of the memory cells should be within one or more distributions of threshold voltages for programmed memory cells or within a distribution of threshold voltages for erased memory cells, as appropriate. FIG. 6 illustrates example threshold voltage distributions for the memory array when each memory cell stores three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. In some embodiments, when programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 6 also shows Vev, which is a voltage level to test whether a memory cell has been properly erased.

However, in some embodiments of predictive programming the system does not perform verify for at least some of the states for at least one programming pass. For example, memory cells that are targeted to any of states S1, S2, S3 might be verified at Vv1. After memory cells targeted to states S2 or S3 reach Vv1, those memory cells are predictively programmed to their respective states, in one embodiment. Similarly, memory cells that are targeted to any of states S4, S5, S6, or S7 might be verified at Vv4. After memory cells targeted to states S5, S6, or S7 reach Vv4, those memory cells are predictively programmed to their respective states, in one embodiment.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. In some embodiments, data states S1-S7 can overlap, with controller 122 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states S4-S7 are programmed to an intermediate state that is no higher than S4 in a first phase. Memory cells to end up in any of data states S0-S3 do not receive programming in the first phase. In a second phase, memory cells to end up in either data state S2 or S3 are programmed to a state that is no higher than S2; memory cells to end up in either data state S6 or S7 are programmed to a state that is no higher than S6. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 6) or verify operation (e.g. see verify target levels Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIGS. 7A and 7B described one example of a multi-pass programming process, referred to as Foggy-Fine Programming. Prior to the foggy-fine program scheme, memory cells may be erased to state S0. The foggy-fine program scheme comprises a foggy program phase followed by a fine program phase. The foggy program phase (e.g., the first phase or first step) has a larger program step size ($\Delta$Vpgmfog) than the program step size ($\Delta$Vpgmfn) of the fine program phase (e.g., the second phase or second step). A program state may be referred to more briefly as a "state." The fine program phase is used to tighten the Vt distributions.

FIG. 7A depicts the first pass of the multi-pass programming process, which includes programming the memory cells from the erased state (E) to any of the programmed data states S1-S7, similar to full sequence programming. However, rather than using the standard verify reference voltages (e.g., Vv1, Vv2, Vv3, Vv4, Vv5, Vv6, and Vv7), the process of FIG. 7A uses an alternate set of verify reference voltages (e.g., Vv1 ', Vv2', Vv3', Vv4,' Vv5', Vv6', and Vv7') that are each slightly lower than the corresponding standard verify reference voltage. Thus, the threshold voltages of FIG. 7A can be thought of as intermediate threshold voltage distributions (or intermediate data states) that are at lower voltages than the threshold voltages of FIG. 6. Note that memory cells in the erased state E that are to be in data state S0, are inhibited from programming.

For ease of explanation, the foggy phase was explained with reference to an example in which verification is performed at seven levels (Vv1'-Vv7'). In some embodiments of predictive programming, the system does not perform a verify at all of the verify levels in FIG. 7A. For example, memory cells to be programmed to S1, S2 or S3 may be verified at reference level Vv1'. Memory cells to be programmed to S4, S5, S6 or S7 may be verified at reference level Vv4'. Then, memory cells to be programmed to S2, S3, S5, S6, or S7 are predictively programmed to their respective target states. Predictive programming speeds up programming by reducing the number of verify operations.

FIG. 7B depicts the second (and last) pass of the multi-pass programming process, which includes programming the memory cells to tighten the threshold distributions. Thus, the memory cells are programmed from the intermediate threshold voltage distributions (or intermediate data states) of FIG. 7A to the final or target threshold voltage distributions (or data states) of FIG. 7B using the standard verify reference voltages (e.g., Vv1, Vv2, Vv3, Vv4, Vv5, Vv6, and Vv7). FIG. 7A is referred to as the Foggy pass and FIG. 7B as the Fine Pass. In one embodiment, the Foggy pass of FIG. 7A is performed for a given word line, followed by the Foggy pass for the next word line. The Foggy pass for the next word line could give rise to interference for the given word line, thereby widening the intermediate threshold voltage distributions, which could lead to errors when reading the data. However, the Fine pass of FIG. 7B is subsequently performed after Foggy pass for the next word line, removing or reducing the effects of interference from the next word line. Note that memory cells in the erased state E that are to be in data state S0, are inhibited from programming.

At the end of programming, each of the eight states has what is referred to as a Vt distribution. The voltage gap between two adjacent states is referred to as the Vt margin. It is desirable to have a large Vt margin. It is also desirable to have fast programming. Embodiments disclosed herein achieve a large Vt margin with fast programming. Embodiments disclosed herein reduce or eliminate NWI interference during a fine programming stage. Embodiments disclosed herein avoid over-programming during a fine programming stage.

In one embodiment, the foggy-fine program scheme is implemented in a Bit-Cost-Scalable (BiCs) architecture. FIGS. 7A and 7B depict an example in which memory cells are programmed to three bits per memory cell. In one embodiment, memory cells are programmed to four bits per memory cell (referred to herein as "QLC", quad level cell). A foggy-fine program scheme can compensate for Neighbor Word line Interference ("NWI") effect significantly by reducing the threshold voltage (Vt) difference between foggy and fine.

FIGS. 8A and 8B depict one embodiment in which predictive programming is used to reduce the number of verifies during a programming operation. FIG. 8A shows that memory cells are first programmed from S0 to a threshold voltage reference level at a lower tail of one of four checkpoint states (CPA, CPB, CPC, CPD). After a programming pulse the memory cells are checked to determine their Vt relative to their target state and/or the checkpoint states. Until the memory cell's Vt reaches its checkpoint state, it receives "full programming" on the next program loop by way of the voltage of the program enable voltage applied to the bit line of the memory cell, in one embodiment. For example, a full program enable voltage (e.g., VSS or 0V) is applied to the bit line associated with the memory cell (and a program voltage is applied to the memory cell's control gate).

An example will be discussed in which the memory cells are programmed to one of sixteen states (S0-S15). For example, memory cells to be programmed to any of states S1, S2, or S3 receive a program pulse followed by a program verify until the memory cell reaches reference level VclA, which is at the lower tail of checkpoint state CPA 802. Memory cells to be programmed to any of states S4, S5, S6, or S7 receive a program pulse followed by a program verify until the memory cell reaches reference level VclB, which is at the lower tail of checkpoint state CPB 804. Memory cells to be programmed to any of states S8, S9, S10, or S11 receive a program pulse followed by a program verify until the memory cell reaches reference level VclC, which is at the lower tail of checkpoint state CPC 806. Memory cells to be programmed to any of states S12, S13, S14, or S15 receive a program pulse followed by a program verify until the memory cell reaches reference level Vcl1D, which is at the lower tail of checkpoint state CPD 808. Those of skill in the art recognize that programming from state 0, S0, the erased state can be done by applying a single pulse to the cells to change their Vt to the checkpoint state CPA, CPB, CPC, CPD and a single program verify, or a series of program pulses with associated program verify operations can be applied to the cells until they reach a checkpoint state CPA, CPB, CPC, CPD.

FIG. 8B depicts programming of the memory cells from the checkpoint states 802, 804, 806, 808 to their respective target states. For example, some memory cells are programmed from checkpoint state CPA 802 to one of states S1, S2, or S3. Some memory cells are programmed from checkpoint state CPB 804 to one of states S4, S5, S6, or S7. Some memory cells are programmed from checkpoint state CPC 806 to one of states S8, S9, S10, or S11. Some memory cells are programmed from checkpoint state CPD 808 to one of states S12, S13, S14, or S15.

It should be noted that some memory cells targeted to states that overlap the checkpoint states CPA, CPB, CPC, CPD, may be within the desired target state such that those cells receive no more programming. Examples could be memory cells targeted for states S1, S4, S8, and S12. Memory cells to be programmed to any of states S2, S3, S5, S6, S7, S9, S10, S11, S13, S14, or S15 receive one or more additional program pulses after reaching their respective checkpoint states. However, program verify operations are not performed for these states after the checkpoint state has been reached, in one embodiment. Applying one or more program voltages without performing a program verify operation to determine whether the memory cell has reached its target state is referred to herein as "predictive programming." Hence, a reduced number of verify operations is performed. A non-checkpoint state ("non-CP state") is a target state that does not overlap with a checkpoint state. A non-checkpoint state is also a state that is a target state for memory cells predictively programmed from a checkpoint state to the target state. Hence, states S2 and S3 are non-checkpoint states associated with checkpoint state CPA 802; S5, S6, and S7 are non-checkpoint states associated with checkpoint state CPB 804; S9, S10, and S11 are non-checkpoint states associated with checkpoint state CPC 806; and S13, S14, and S15 are non-checkpoint states associated with checkpoint state CPD 808. In FIG. 8B, states S1, S4, S8, and S12 are not considered to be non-CP states because the memory cells are not predictively programmed to states S1, S4, S8, and S12 and these states overlap checkpoint states, in one embodiment. In FIG. 8B, states S1, S4, S8, and S12 are referred to as CP states, in one embodiment. In certain embodiments, certain memory cells with a Vt greater than a verify low threshold for a checkpoint state may still receive one more program pulses so that the Vt moves to within the pre-defined target state, S1, S4, S8, or S12. Moreover, each of CP states S1, S4, S8, and S12 is associated with one of CP states 802, 804, 806, 808 by way of the verify low and associated verify high voltage. Note that for each verify low voltage the next highest verify voltage in FIG. 8B is an associated verify high voltage.

FIG. 8B depicts a second set of verify levels (VchA, VchB, VchC, VchD), which are referred to herein as verify high (VH) reference levels. Each of these verify high reference levels is associated with one of the verify low (VL) reference levels. The lower tail of some of the states is at one of the verify high reference levels, in this example. For example, the lower tail of state S1 is at VchA, the lower tail of state S4 is at VchB, the lower tail of state S8 is at VchC, and the lower tail of state S12 is at VchD. Memory cells to be programmed to one of states S1, S4, S8 or S12 are programmed using quick pass write (QPW) after reaching their respective verify low reference levels, in one embodiment.

The idea of QPW is to slow down cell programming when the cell is close to its target state. A verify low (e.g., VclA) and a verify high (VchA) verify reference level is used to determine what voltage to apply to the bit line. If the memory cell's Vt is below the verify low reference level, the memory cell receives "full programming" on the next program loop. Full programming is achieved by applying a program voltage to the memory cell's control gate (e.g., apply program voltage to word line) while applying a full program enable voltage to the bit line associated with the memory cell. The full program enable voltage is VSS (about 0 V), in one embodiment.

If the memory cell's Vt is between the verify low reference level and the verify high program level, the memory cell receives "weak programming" on the next program loop. Weak programming is achieved by applying a program voltage to the memory cell's control gate (e.g., apply program voltage to selected word line) while applying a weak program enable voltage to the bit line associated with the memory cell. The weak program enable voltage may also be referred to as a quick pass write (QPW) voltage. The QPW voltage allows the memory cell to program, but the memory cell will program more weakly than with the full programming of the full program enable voltage (assuming the same program voltage is applied to the memory cell's control gate). Thus, the QPW voltage provides a way to slow the programming of the memory cell.

When performing QPW, if the memory cell's Vt is above the verify high reference level, the memory cell is inhibited from programming on the next program loop. This may be referred to as locking out the memory cell from further programming. Program inhibit is achieved by applying the program inhibit voltage to the bit line associated with the memory cell to prevent the program voltage from programming the memory cell. Note the boosting voltages (e.g., Vpass) may also be applied to unselected word lines to boost the NAND channel potential. The program inhibit voltage cuts off the NAND channel from the bit line to allow the boosting voltages to raise the NAND channel potential, in one embodiment. The program inhibit voltage is VDD (about 2 V), in one embodiment. The QPW voltage is larger than the full program enable voltage, but smaller than the program inhibit voltage, in one embodiment.

For example, memory cells to be programmed to state S1 continue to receive additional programming until their Vt reaches VchA. However, after such memory cells reach VclA, the voltage on the bit line is changed from a full program enable voltage (e.g., 0V) to what is referred to herein as a weak program enable voltage (e.g., 0.5V). Moreover, a verify operation may be performed at the verify high reference level. Hence, these memory cells are not referred to as a non-checkpoint state, in one embodiment.

The bit line voltages that are applied during predictive programming depend on whether the Vt of the memory cell was between the verify low reference level and the verify high reference level or was above the verify high reference level, in one embodiment. For example, the bit line voltage during predictive programming of a memory cell being programmed to state S2 or S3 depends on whether the Vt of the memory cell was between VclA to VchA or was above VchA (when the memory cell was verified to have reached its checkpoint state), in one embodiment. Similarly, the bit line voltage during predictive programming of a memory cell being programmed to state S5, S6, or S7 depends on whether the Vt of the memory cell was between VclB to VchB or was above VchB, in one embodiment. Similarly, the bit line voltage during predictive programming of a memory cell being programmed to state S9, S10, or S11 depends on whether the Vt of the memory cell was between VclC to VchC or was above VchC, in one embodiment. Similarly, the bit line voltage during predictive programming of a memory cell being programmed to state S13, S14, or S15 depends on whether the Vt of the memory cell was between VclD to VchD or was above VchD, in one embodiment.

Figure 9:
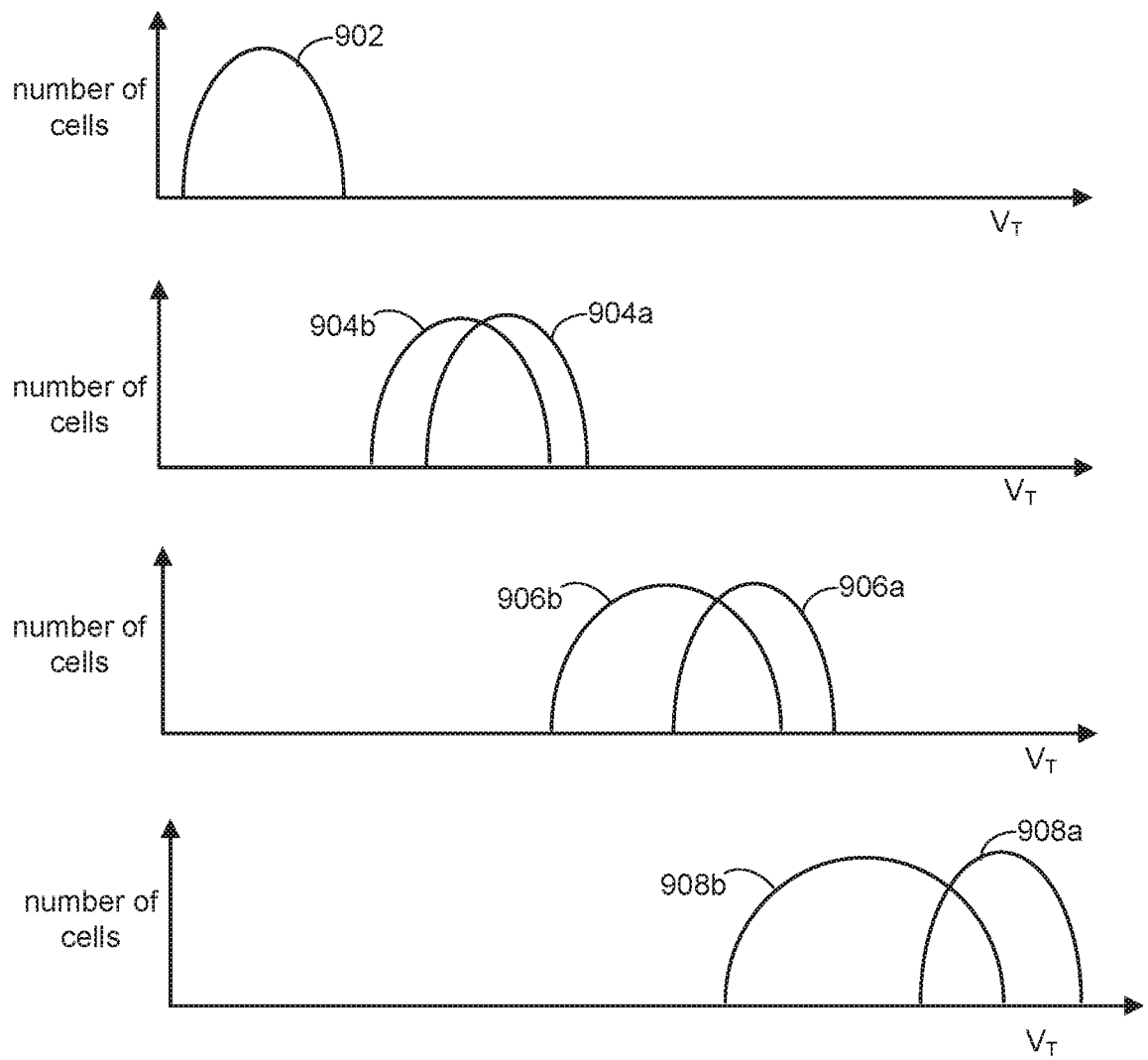
FIG. 9 depicts a potential problem with Vt distributions after a predictive programming process.

The Vt distributions of states S0-S15 represent one embodiment after a foggy programming phase. One potential problem with the Vt distributions is discussed in connection with FIG. 9. Distributions 902, 904a, 906a, and 908a each represent distributions that are within target Vt ranges for the respective states after a foggy programming phase. For example, distribution 902 may be for S4, distribution 904a may be for S5, distribution 906a may be for S6, and distribution 908a may be for S7. Distributions 904b, 906b, and 908b represent possible distributions for predictively programmed states that do not fall into target Vt ranges for the respective states. For example, distribution 904b may be for S5, distribution 906b may be for S6, and distribution 908b may be for S7. Embodiments described and claimed herein improve the Vt distributions of predictively programmed states. In other words, embodiments described herein produce Vt distributions that are closer to distributions 904a, 906a, and 908a than distributions 904b, 906b, and 908b.

For at least some of the Vt distributions, the lower tail of the predictively programmed states is further from the target than the upper tail. For example, the gap between the lower tail of Vt distribution 904b and the lower tail of Vt distribution 904a may be wider than the gap between the upper tail of Vt distribution 904b and the upper tail of Vt distribution 904a. Likewise, the gap between the lower tail of Vt distribution 906b and the lower tail of Vt distribution 906a may be wider than the gap between the upper tail of Vt distribution 906b and the upper tail of Vt distribution 906a. Also, the gap between the lower tail of Vt distribution 908b and the lower tail of Vt distribution 908a may be wider than the gap between the upper tail of Vt distribution 908b and the upper tail of Vt distribution 908a. In some embodiments of predictive programming, the strength (e.g., magnitude and/or time) of the program enable voltages applied to the bit lines is managed to place the Vt distributions closer to the target Vt distributions. Some embodiments of predictive programming target the lower tails of the Vt distributions to put the lower tails closer to the target ranges (e.g., distributions 904a, 906a, 908a). Some embodiments of predictive programming target both the lower tails and the upper tails of the Vt distributions to put both tails closer to the target ranges (e.g., distributions 904a, 906a, 908a).

Also note that the predictive programmed Vt distributions could potentially become farther from their target ranges for states having Vts further from the checkpoint state. For example, the gap between the lower tail of Vt distribution 908b and the lower tail of Vt distribution 908a may be wider than the gap between the lower tail of Vt distribution 906b and the lower tail of Vt distribution 906a. Likewise, the gap between the lower tail of Vt distribution 906b and the lower tail of Vt distribution 906a may be wider than the gap between the lower tail of Vt distribution 904b and the lower tail of Vt distribution 904a. Also, Vt distribution 904b may be wider than Vt distribution 902, Vt distribution 906b may be wider than Vt distribution 904b, and Vt distribution 908b may be wider than Vt distribution 906b. Some embodiments of predictive programming apply state dependent program enable voltages to the bit lines in order to provide a greater impact on states having Vts further from the checkpoint state.

Thus, embodiments improve the Vt distributions for predictive programmed states. Therefore, predictive programmed Vt distributions may be located very close to a target range after foggy programming. The improved locations of the Vt distributions can reduce NWI during a subsequent fine programming phase. The improved locations of the Vt distributions can reduce over-programming during a subsequent fine programming phase.

Figure 10:
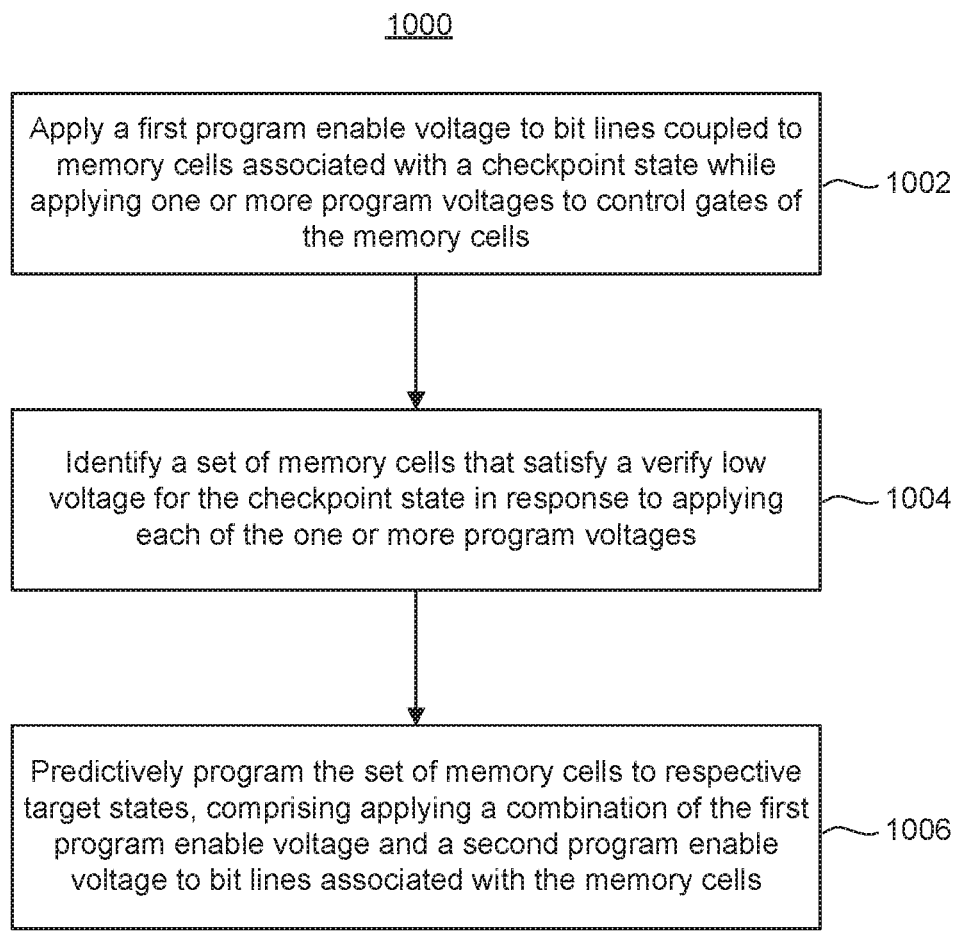
FIG. 10 is a flowchart of one embodiment of a process of predictive programming.

FIG. 10 is a flowchart of one embodiment of a process 1000 of predictive programming. In one embodiment, process 1000 is used in one phase of a multi-phase programming process. In one embodiment, process 1000 is used in a foggy phase of a foggy-fine programming process. Process 1000 is used to program NAND memory cells, in one embodiment. The memory cells are in a three-dimensional memory array, in one embodiment. In one embodiment, the NAND memory is in a Bit-Cost-Scalable (BiCs) architecture.

Step 1002 includes applying a first program enable voltage to bit lines coupled to memory cells associated with a checkpoint state while applying one or more program voltages to control gates of the memory cells. The first program enable voltage is a full program enable voltage (e.g., 0V or VSS), in one embodiment.

Step 1004 includes identifying a set of memory cells that satisfy a verify low voltage for the checkpoint state in response to applying each of the one or more program voltages. For example, with reference to FIGS. 8A and 8B memory cells that are targeted for S1, S2, or S3, are verified at VclA, memory cells that are targeted for S4, S5, S6, or S7 are verified at VclB, memory cells that are targeted for S8, S9, S10, or S11 are verified at VclC, and memory cells that are targeted for S12, S13, S14, or S15 are verified at VclD. Step 1004 also identifies a set of memory cells that are to be predictively programmed and have a threshold voltage between the verify low voltage and a verify high voltage, in one embodiment. For example, memory cells to be programmed to S2 or S3 that have a Vt between VclA and VchA are identified. As another example, memory cells to be programmed to S5, S6, or S7 that have a Vt between VclB and VchB are identified. As another example, memory cells to be programmed to S9, S10, or S11 that have a Vt between VclC and VchC are identified. As another example, memory cells to be programmed to S13, S14, or S15 that have a Vt between VclD and VchD are identified.

Step 1006 includes predictively programming the set of memory cells to respective target states. The predictively programming comprises applying a combination of the first program enable voltage and a second program enable voltage to bit lines associated with the memory cells in the set while applying additional program voltages to control gates of the memory cells in the set.

The second program enable voltage has a different strength (e.g., magnitude and/or time applied to the bit line) than the first program enable voltage, in one embodiment. The second program enable voltage is weaker than the first program enable voltage, in one embodiment. The second program enable voltage has a different magnitude than the first program enable voltage, in one embodiment. The second program enable voltage has a larger magnitude than the first program enable voltage, in one embodiment. The second program enable voltage is a weak program enable voltage and the first program enable voltage is a full program enable voltage, in one embodiment.

Figure 11:
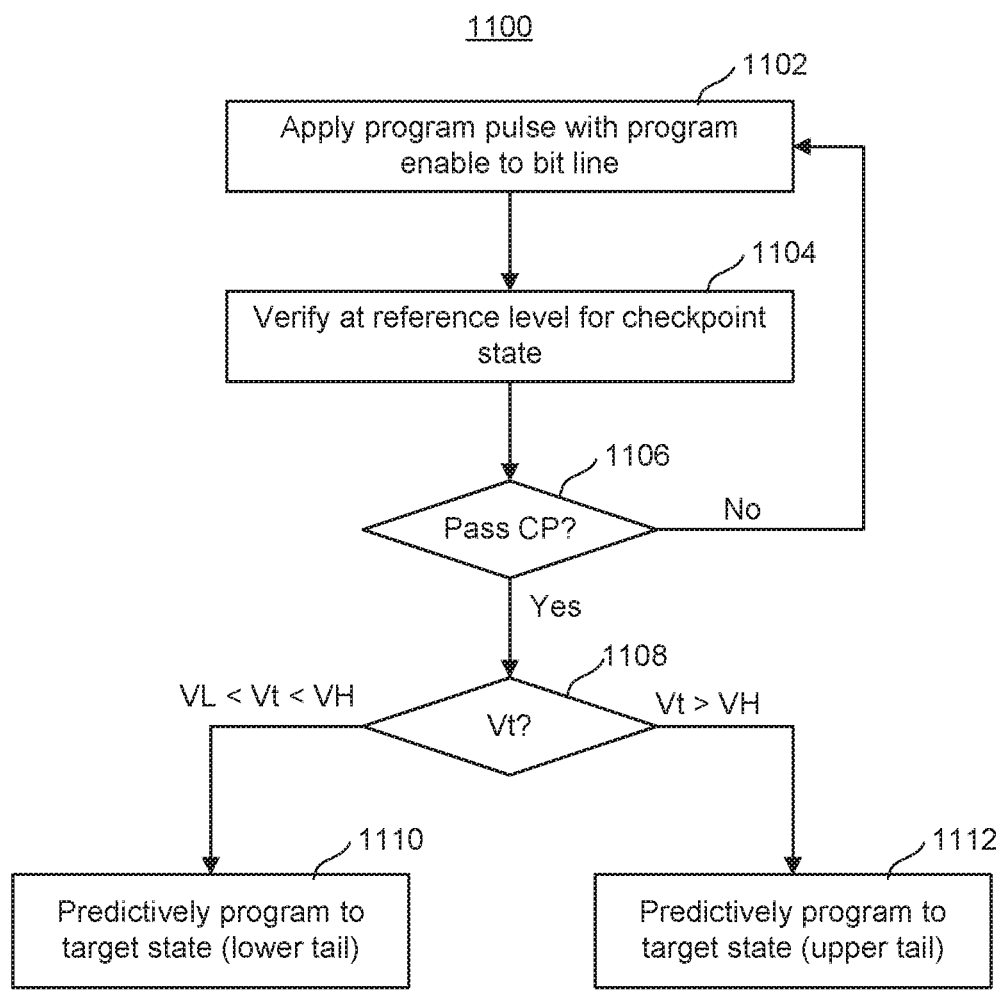
FIG. 11 is a flowchart of one embodiment of a process of predictive programming.

FIG. 11 is a flowchart of one embodiment of a process 1100 of predictive programming. In one embodiment, process 1100 is used in a foggy phase of a foggy-fine programming process. The process 1100 describes programming of one memory cell. It will be understood that the process 1100 may be performed on many memory cells during a programming operation on the memory cell. For example, the process may be performed on memory cells on a selected word line. For ease of discussion, process 1100 discusses programming one memory cell. It will be understood that many memory cells may undergo process 1100 during a programming process such as process 500 (see FIG. 5).

Step 1102 includes applying a program pulse to the memory cell while applying a program enable voltage to the bit lines coupled to the memory cell. In one embodiment, the program pulse is applied to a selected word line connected to a group of memory cells. In one embodiment, the program enable voltage has a magnitude of 0V. In one embodiment, the program enable voltage is a full program enable voltage.

Step 1104 includes verifying the memory cell at a verify reference level for the checkpoint state associated with the memory cell. In process 1100 this level is referred to as a verify low reference level (VL). FIG. 8A depicts several examples of checkpoint states and their associated verify reference levels.

Step 1106 includes a determination of whether the Vt of the memory cell has reached the checkpoint state associated with the memory cell. If not, then the process returns to step 1102 to apply another program pulse to the memory cell. When the Vt of the memory cell reaches the checkpoint state, a determination is made in step 1108 as to whether the Vt is between a verify low reference level and a verify high reference level (VH) or is instead above the verify high reference level.

The verify low reference level (VL) and the verify high reference level (VH) refer to voltages associated with the checkpoint state to which the memory cell was programmed. For example, with reference to FIG. 8B, for states S5, S6, and S7, the verify low reference level (VL) is VclB and the verify high reference level is VchB. Note that the verify low reference level (VclB) is the verify reference level for CPB 804, and the verify high reference level (VvhB) is the verify reference level for S4, in this example. Because of this association, state S4 may also be referred to herein as a checkpoint state.

If the Vt is between the verify low reference level and the verify high reference level, then the memory cell is predictively programmed to its target state using what is referred to as a lower tail process, in step 1110.

If the Vt is between the verify low reference level and the verify high reference level, then the memory cell is predictively programmed to its target state using what is referred to as an upper tail process, in step 1112.

Figures 12A, 12B:
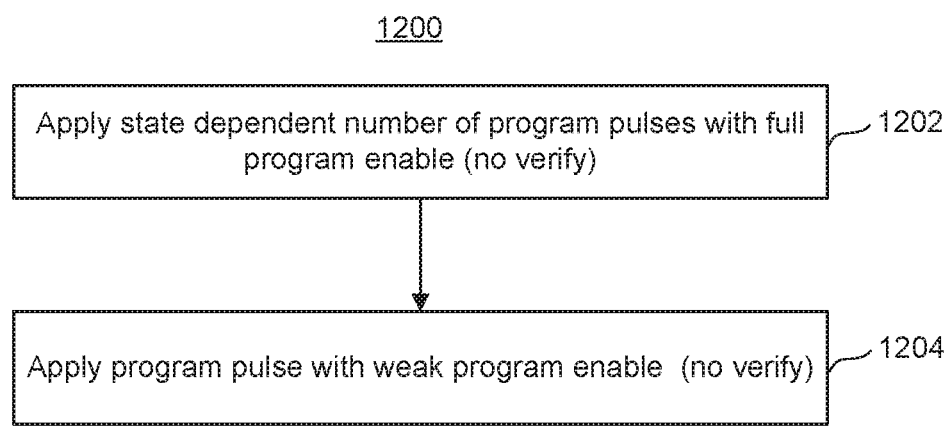
FIG. 12A is a flowchart of one embodiment of a process of predictive programming.
FIG. 12B shows a table of voltages that may be applied to bit lines during one embodiment of the process of FIG. 12A.

FIG. 12A is a flowchart of one embodiment of a process 1200 of predictive programming. The process 1200 is one embodiment of step 1110 of process 1100. The process is used during the foggy program phase of a foggy-fine program scheme, in one embodiment. However, process 1200 is not limited to foggy-fine programming. In one embodiment, process 1200 is used for a one pass programming process. For example, process 1200 may be used for programming two bits per cell with one checkpoint state. FIG. 12A will be discussed in connection with the table 1250 FIG. 12B, which depicts one embodiment of voltages applied to bit lines during predictive programming. The table 1250 covers three non-CP states, which are defined based on their Vt relative to the checkpoint state. Table 1250 illustrates the program enable voltage type/level used for memory cells having a Vt between a verify low reference level (VL) and a verify high reference level (VH) when the memory cell first reaches the checkpoint state. In table 1250, the program enable voltages have state dependent strengths at least because the average magnitude of the program enable voltages depends on the target state. The program enable voltages are also an example of state dependent average voltage magnitudes.

In general, each checkpoint state (e.g., CPA 802, CPB 804, CPC 806, CPD 808) may be associated with "n" non-CP states. However, it will be understood that "n" could be different for the different CP states. For example, with reference to FIG. 8B, non-CP states S2 and S3 are associated with checkpoint state CPA 802, this means n=2 because there are two non-CP states associated with checkpoint state CPA 802. Whereas non-CP states S5, S6, and S7 are associated with checkpoint state CPB 804, this means n=3 because there are three non-CP states associated with checkpoint state CPB 804.

For the purpose of discussion, the non-CP states are referred to as CP+1, CP+2, . . . CP+n, depending on their distance (in terms of Vt, along a VT distribution graph) from the associated CP-state. In other words, the non-CP states are referred to as CP+1, CP+2, . . . CP+n depending on the number of non-CP states between the CP state and the last non-CP state of the associated checkpoint state (including the last non-CP state). For example, with reference to FIG. 8B, if CPB 804 is the CP state, then S5 is referred to as CP+1, S6 is referred to as CP+2, and S7 is referred to as CP+3.

Another way to view "n" is with respect to a state that is not predictively programmed from the checkpoint state. For example, with reference to FIG. 8B, state S4 is verified at the verify high level of VchB and is thus not predictively programmed, in one embodiment. When predictively programming a memory cell, the number "n" may be described as the number of non-CP states between the CP state defined by a verify high level and the last non-CP state of the associated checkpoint state (including the last non-CP state). For example, with reference to FIG. 8B, state S6 is two states after state S4, thus n=2. Thus, it may be stated that "n" is how many states each non-checkpoint state is beyond the associated checkpoint state. The table 1250 has entries for four program pulses (P1-P4). These refer to the first four program pulses applied to a memory cell after the memory cell reaches its checkpoint state. In some cases, a "full program enable voltage" is applied to the bit line. In some cases, a "weak program enable voltage" is applied to the bit line. In some cases, a "program inhibit voltage" is applied to the bit line.

Step 1202 includes applying a state dependent number of program pulses to memory cells with a full program enable voltage (e.g., 0V) applied to the bit lines. Program verify is not performed for the memory cells being predictively programmed after any of these program pulses. It is possible that a program verify operation is performed for memory cells still being programmed to their respective checkpoint states. With reference to the embodiment in table 1250, one full program pulse is applied to memory cells referred to as state CP+1, two full program pulses are applied to memory cells referred to as state CP+2, and three full program pulses are applied to memory cells referred to as state CP+3. In other embodiments, more or fewer pulses can be applied with the full program enable voltage applied to the bit line.

Step 1204 includes applying a program pulse to the memory cells with a weak program enable voltage (e.g., 0.5V) to the bit lines. With reference to the embodiment described in table 1250, the weak program enable voltage is applied to the bit line on the second program pulse (P2) after memory cells targeted for state CP+1 reach the checkpoint state. Memory cells targeted for state CP+1 will experience all four program pulses (P1-P4) however the influence of those program pulses will be affected by the program enable voltage (e.g. full, weak) or program inhibit voltage applied to the memory cell's bit line. As illustrated in table 1250, the memory cells targeted for state CP+1 receive the full program enable voltage, weak program enable voltage, program inhibit voltage, and program inhibit voltage in sequence.

With reference to the embodiment described in table 1250, the weak program enable voltage is applied to the bit line on the third program pulse (P3) after memory cells targeted for state CP+2 reach the checkpoint state. With reference to the embodiment described in table 1250, the weak program enable voltage is applied to the bit line on the fourth program pulse (P4) after memory cells targeted for state CP+3 reach the checkpoint state. In other embodiments, more pulses can be applied with the weak program enable voltage applied to the bit line. It is not required that the same number of weak program enable voltages are used for each state. In some embodiments, the number of weak program enable voltages is state dependent. For example, one weak program enable voltage might be used for CP+1, two weak program enable voltages might be used for CP+2, and three weak program enable voltage might be used for CP+3. Thus, "n" program pulses are applied to different sets of memory cells with the weak program enable voltage applied to the bit line without verifying the memory cells, in one embodiment.

After step 1204, the memory cells have been predictively programmed to their respective target states. It is not required to apply any program pulses to a memory cell after it has been predictively programmed to its respective target state. However, in the event that one or more program pulses are applied, a program inhibit voltages may be applied to bit line to inhibit further programming. Table 1250 shows that program inhibit voltages may be applied to bit lines afterwards to keep the memory cells from being over-programmed.

FIG. 13A is a flowchart of one embodiment of a process 1300 of predictive programming. The process 1300 is one embodiment of step 1112 of process 1100. Thus, process 1300 may be used for predictive programming of memory cells having a Vt above the verify high reference level when the memory cell first reaches the checkpoint state, whereas process 1200 may be used for predictive programming of memory cells having a Vt between the verify low reference level and the verify high reference level when the memory cell first reaches the checkpoint state. Process 1200 targets the lower tail of the Vt distribution, whereas process 1300 targets the upper tail of the Vt distribution, in one embodiment. Process 1200 provides somewhat stronger programming than process 1300 in one embodiment. Hence, using process 1200 in combination with process 1300 can result in the lower tail of the Vt distribution being at a target level without over-programming the upper tail.

The process 1300 is used during the foggy program phase of a foggy-fine program scheme, in one embodiment. FIG. 13A will be discussed in connection with the table 1350 FIG. 13B, which depicts one embodiment of voltages applied to bit lines during predictive programming. Table 1350 is for memory cells having a Vt above verify high reference level when the memory cell first reaches the checkpoint state. The table 1350 is similar to table 1250, as it may be used in the same process 1100 (see FIG. 11).

Step 1302 includes applying a state dependent number of program pulses to memory cells with a full program enable voltage (e.g., 0V) applied to the bit lines. Program verify is not performed for the memory cells being predictively programmed after any of these program pulses. With reference to the embodiment in table 1350, one program pulse is applied to memory cells referred to as state CP+1, two program pulses are applied to memory cells referred to as state CP+2, and three program pulses are applied to memory cells referred to as state CP+3. Thus, "n" program pulses are applied to the memory cells with the full program enable voltage applied to the bit line without verifying the memory cells, in one embodiment. In other embodiments, more or fewer pulses can be applied with the full program enable voltage applied to the bit line. Note that the number of full program enable voltages in table 1350 correspond to those in table 1250. A difference between table 1350 and 1250 is that the weak program enable voltages are not applied to the bit lines.

After step 1302, the memory cells have been predictively programmed to their respective target states. It is not required to apply any program pulses to a memory cell after it has been predictively programmed to its respective target state. However, in the event that one or more program pulses are applied, a program inhibit voltage may be applied to the bit line to inhibit further programming. Table 1350 shows that program inhibit voltages may be applied to bit lines afterwards to keep the memory cells from being over-programmed.

Figures 14A, 14B:
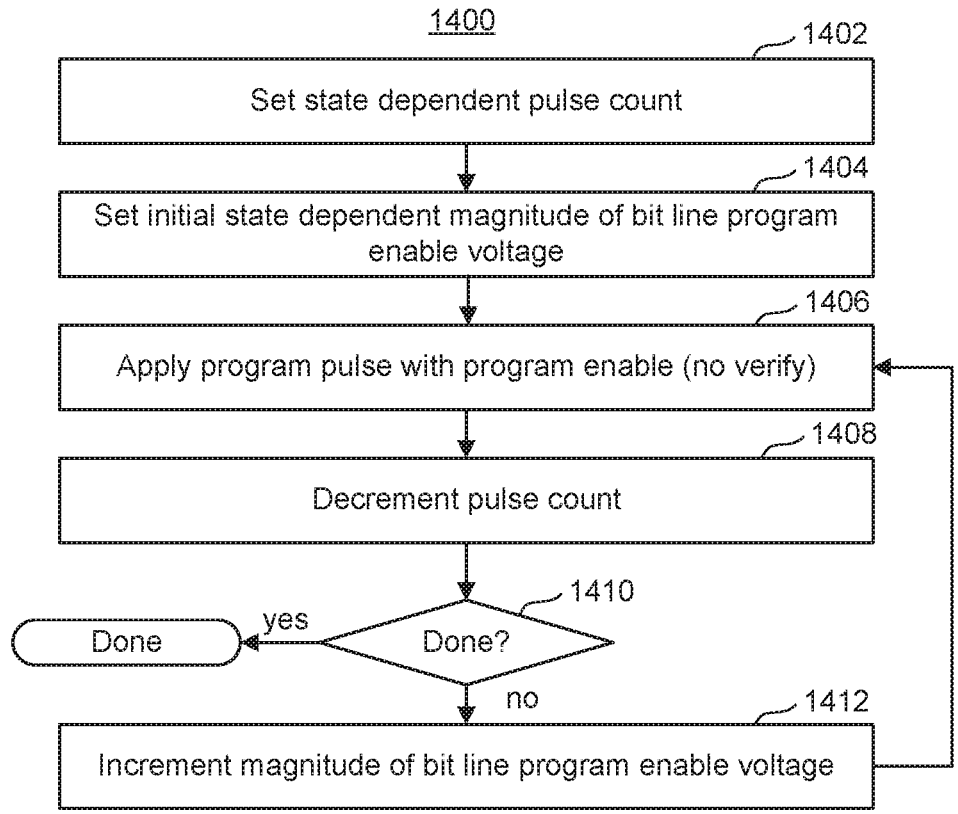
FIG. 14A is a flowchart of one embodiment of a process of predictive programming.
FIG. 14B shows a table of voltages that may be applied to bit lines during one embodiment of the process of FIG. 14A.

FIG. 14A is a flowchart of one embodiment of a process 1400 of predictive programming. The process 1400 is described with respect to programming one memory cell. The process 1400 is one embodiment of step 1110 of process 1100. The process is used during the foggy program phase of a foggy-fine program scheme, in one embodiment. FIG. 14A will be discussed in connection with the table 1450 FIG. 14B, which depicts one embodiment of voltages applied to bit lines during predictive programming. The table 1450 covers three non-CP states, which are defined based on their Vt relative to the checkpoint state. Table 1450 is for memory cells having a Vt between a verify low reference level (VL) and a verify high reference level (VH) when the memory cell first reaches the checkpoint state. Table 1450 refers to a voltage "PE_max", which is the highest magnitude program enable voltage in table 1450. Note that the highest magnitude program enable voltage results in the weakest programming, in process 1400. As one example, PE_max is 0.5V. The delta (Δ) refers to an increment from one program pulse to the next. In table 1450, the program enable voltages increase by delta (Δ) each program pulse. In one embodiment, delta (Δ) is 0.1V. However, delta could be larger or smaller. In table 1450, the program enable voltages have state dependent strengths at least because the average magnitude of the program enable voltages depends on the target state. The program enable voltages are also an example of state dependent average voltage magnitudes.

Step 1402 includes setting a state dependent pulse count for the memory cell. With reference to table 1450, the count is set to n+1, in one embodiment. For example, the count may be set to two for CP+1, three for CP+2, and four for CP+3. Thus, "n+1" program pulses are applied to the memory cells with the weak program enable voltage applied to the bit line without verifying the memory cells, in one embodiment. The count is maintained in a set of latches, in one embodiment. For example, the count could be maintained in latches in managing circuit 190 in sense block 51 (e.g., one or more of UDL, MDL, LDL, or other latches).

Step 1404 includes setting an initial state dependent magnitude of the bit line program enable voltage for the memory cell. These are weak program enable voltages, in one embodiment. Table 1450 indicates one technique for establishing the initial state dependent magnitudes. As one example, if PE_max is 0.5V and delta (Δ) is 0.1V then the initial state dependent magnitudes are 0.4V, 0.3V, and 0.2V for CP+1, CP+2, and CP+3, respectively.

Step 1406 includes applying a program pulse to a memory cell with the initial program enable voltage applied to the bit line coupled to the memory cell. Program verify is not performed for the memory cell being predictively programmed after this program pulse.

Step 1408 includes decrementing the pulse count. In one embodiment, this includes changing a value in a data latch in sense block 51. Step 1410 is a determination of whether predictive programming is complete for this memory cell. This determination is based on the status of the data latches in the sense block 51, in one embodiment. If the process 1400 is not complete, then step 1412 is performed.

Step 1412 includes incrementing a magnitude of the bit line program enable voltage. The increment is previously discussed delta, in one embodiment. In one embodiment, the increment is the same for each program pulse. However, in one embodiment, the increment is different for at least one of the pulses. In one embodiment, the increment is the same for each state. However, in one embodiment, the increment is different for at least one of the states. Thus, referring to table 1450, one or more of the deltas may be replaced by an increment having a different magnitude than delta.

After step 1412, the process returns to step 1406 to apply another program pulse with the incremented program enable voltage. After the state dependent number of program pulses have been applied to the memory cell (as tested in step 1410), the memory cell has been predictively programmed to its target state. Table 1450 shows that program inhibit voltages may be applied to bit lines afterwards to keep the memory cells from being over-programmed.

Figures 15A, 15B:
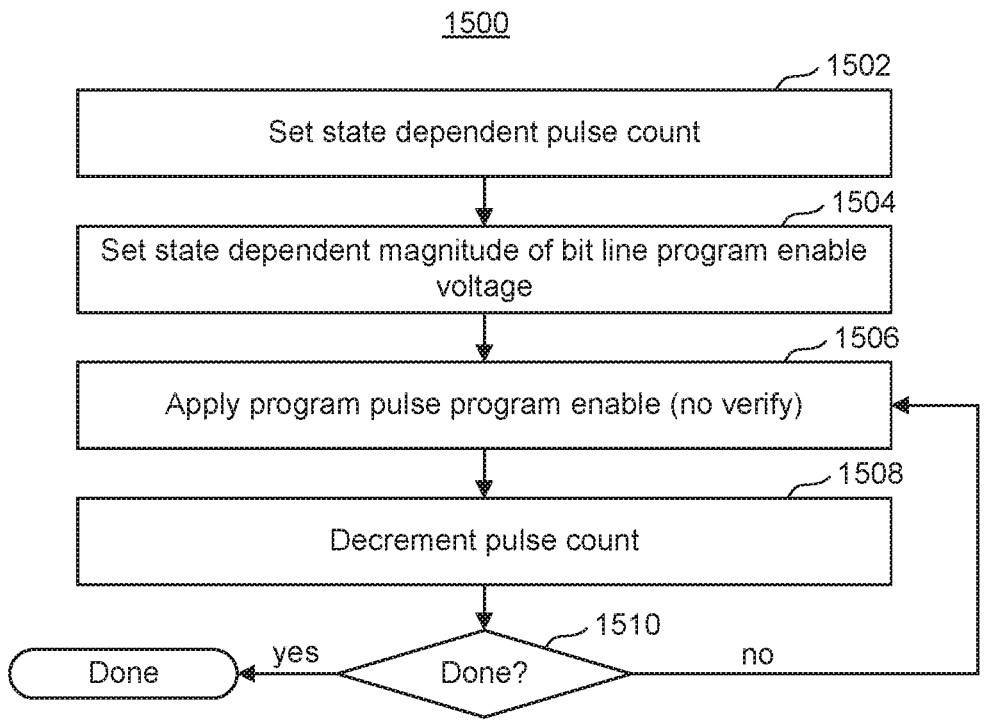
FIG. 15A is a flowchart of one embodiment of a process of predictive programming.
FIG. 15B shows a table of voltages that may be applied to bit lines during one embodiment of the process of FIG. 15A.

FIG. 15A is a flowchart of one embodiment of a process 1500 of predictive programming. The process 1500 is described with respect to programming one memory cell. The process 1500 is one embodiment of step 1110 of process 1100. The process is used during the foggy program phase of a foggy-fine program scheme, in one embodiment. FIG. 15A will be discussed in connection with the table 1550 FIG. 15B, which depicts one embodiment of voltages applied to bit lines during predictive programming. The table 1550 covers three non-CP states, which are defined based on their Vt relative to the checkpoint state. Table 1550 is for memory cells having a Vt between a verify low reference level (VL) and a verify high reference level (VH) when the memory cell first reaches the checkpoint state. Table 1550 refers to a voltage "PE_max". For clarity of discussion, PE_max is used in several different tables depicted in the drawings. PE_max could be the same in the various tables, but that is not a requirement. As one example, PE_max in table 1550 is 0.5V, but could be higher or lower. The alpha (α) refers to a parameter for defining a different magnitude voltage for each state for a given program pulse. In one embodiment, alpha (α) is 0.1V. However, alpha could be larger or smaller. In table 1550, the program enable voltages have state dependent strengths at least because the average magnitude of the program enable voltages depends on the target state. The program enable voltages are also an example of state dependent average voltage magnitudes.

Step 1502 includes setting a state dependent pulse count for the memory cell. With reference to table 1550, the count is set to n+1, in one embodiment. For example, the count may be set to two for CP+1, three for CP+2, and four for CP+3. Thus, "n+1" program pulses are applied to the memory cells with the weak program enable voltage applied to the bit line without verifying the memory cells, in one embodiment. The count is maintained in a set of latches, in one embodiment. For example, the count could be maintained in latches in managing circuit 190 in sense block 51 (e.g., one or more of UDL, MDL, LDL, or other latches).

Step 1504 includes setting a state dependent magnitude of the bit line program enable voltage for the memory cell. These are weak program enable voltages, in one embodiment. Table 1550 indicates one technique for establishing the state dependent magnitudes. As one example, if PE_max is 0.5V and alpha (α) is 0.1V then the state dependent magnitudes are 0.4V, 0.3V, and 0.2V for CP+1, CP+2, and CP+3, respectively.

Step 1506 includes applying a program pulse to a memory cell with the weak program enable voltage applied to the bit line coupled to the memory cell. Program verify is not performed for the memory cell being predictively programmed after this program pulse.

Step 1508 includes decrementing the pulse count. In one embodiment, this includes changing a value in a data latch in sense block 51. Step 1510 is a determination of whether predictive programming is complete for this memory cell. This determination is based on the status of the data latches in the sense block 51, in one embodiment. If the process 1500 is not complete, then step 1506 is performed again. After the state dependent number of program pulses have been applied to the memory cell (as tested in step 1510), the memory cell has been predictively programmed to its target state. Table 1550 shows that program inhibit voltages may be applied to bit lines afterwards to keep the memory cells from being over-programmed.

Figures 16A, 16B:
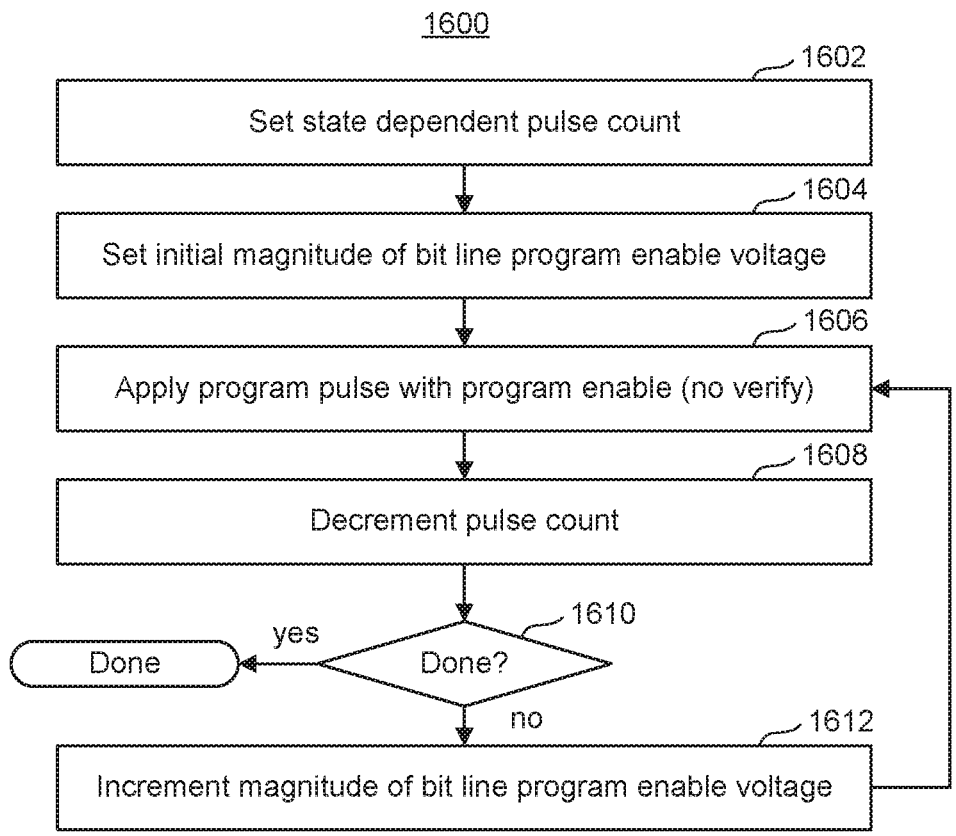
FIG. 16A is a flowchart of one embodiment of a process of predictive programming.
FIG. 16B shows a table of voltages that may be applied to bit lines during one embodiment of the process of FIG. 16A.

FIG. 16A is a flowchart of one embodiment of a process 1600 of predictive programming. The process 1600 is described with respect to programming one memory cell. The process 1600 is one embodiment of step 1112 of process 1100. Thus, process 1600 is one embodiment of predictive programming of memory cells having a Vt of greater then VH when the memory cell first reaches its checkpoint state. In one embodiment, process 1600 is used in combination with process 1400 (which may be used for predictive programming of memory cells having a Vt between VL and VH when the memory cell reaches its checkpoint state). For example, process 1400 may be used in step 1110 of process 1100 and process 1600 may be used in step 1112 of process 1000.

The process 1600 is used during the foggy program phase of a foggy-fine program scheme, in one embodiment. FIG. 16A will be discussed in connection with the table 1650 FIG. 16B, which depicts one embodiment of voltages applied to bit lines during predictive programming. The table 1650 covers three non-CP states, which are defined based on their Vt relative to the checkpoint state. Table 1650 is for memory cells having a Vt above a verify high reference level (VH) when the memory cell first reaches the checkpoint state. Table 1650 refers to a voltage "PE_max", which is the highest magnitude program enable voltage in table 1650. As one example, PE_max in table 1650 is 0.5V. The parameter beta (β) refers to an increment from one program pulse to the next. In table 1650, the program enable voltages increase by beta (β) each program pulse. In one embodiment, beta (β) is related to delta in table 1450. In one embodiment, beta is smaller than delta. Since beta is subtracted from WE max, a smaller beta results in a larger magnitude for the program enable voltage, which may result in slower (e.g., weaker) programming of the memory cells in process 1600 relative to process 1400. In table 1650, the program enable voltages have state dependent strengths at least because the average magnitude of the program enable voltages depends on the target state. The program enable voltages are also an example of state dependent average voltage magnitudes.

Step 1602 includes setting a state dependent pulse count for the memory cell. With reference to table 1650, the count is set to n+1, in one embodiment. For example, the count may be set to two for CP+1, three for CP+2, and four for CP+3. Thus, "n+1" program pulses are applied to the memory cells with the weak program enable voltage applied to the bit line without verifying the memory cells, in one embodiment. The count is maintained in a set of latches, in one embodiment. For example, the count could be maintained in latches in managing circuit 190 in sense block 51 (e.g., one or more of UDL, MDL, LDL, or other latches).

Step 1604 includes setting an initial state dependent magnitude of the bit line program enable voltage for the memory cell. These are weak program enable voltages, in one embodiment. Table 1650 indicates one technique for establishing the initial state dependent magnitudes. As one example, if PE_max is 0.5V and beta (β) is 0.05V then the initial state dependent magnitudes are 0.45V, 0.4V, and 0.35V for CP+1, CP+2, and CP+3, respectively.

Step 1606 includes applying a program pulse to a memory cell with the initial weak program enable voltage applied to the bit line coupled to the memory cell. Program verify is not performed for the memory cell being predictively programmed after this program pulse.

Step 1608 includes decrementing the pulse count. In one embodiment, this includes changing a value in a data latch in sense block 51. Step 1610 is a determination of whether predictive programming is complete for this memory cell. This determination is based on the status of the data latches in the sense block 51, in one embodiment. If the process 1600 is not complete, then step 1612 is performed.

Step 1612 includes incrementing a magnitude of the bit line program enable voltage. The increment is the previously discussed beta, in one embodiment. In one embodiment, the increment is the same for each program pulse. However, in one embodiment, the increment is different for at least one of the pulses. In one embodiment, the increment is the same for each state. However, in one embodiment, the increment is different for at least one of the states. Thus, referring to table 1650, one or more of the betas may be replaced by an increment having a different magnitude than beta.

After step 1612, the process returns to step 1606 to apply another program pulse with the incremented weak program enable voltage. After the state dependent number of program pulses have been applied to the memory cell (as tested in step 1610), the memory cell has been predictively programmed to its target state. Table 1650 shows that program inhibit voltages may be applied to bit lines afterwards to keep the memory cells from being over-programmed.

Process 1600, as well as table 1650, may be modified. One example is to modify the magnitude of beta relative to the magnitude of delta in table 1450. In one embodiment, beta and delta have the same magnitude. In one embodiment, beta is larger than delta. If beta is larger than delta, then process 1600 may result in stronger (or faster) programming than process 1400.

Figures 17A, 17B:
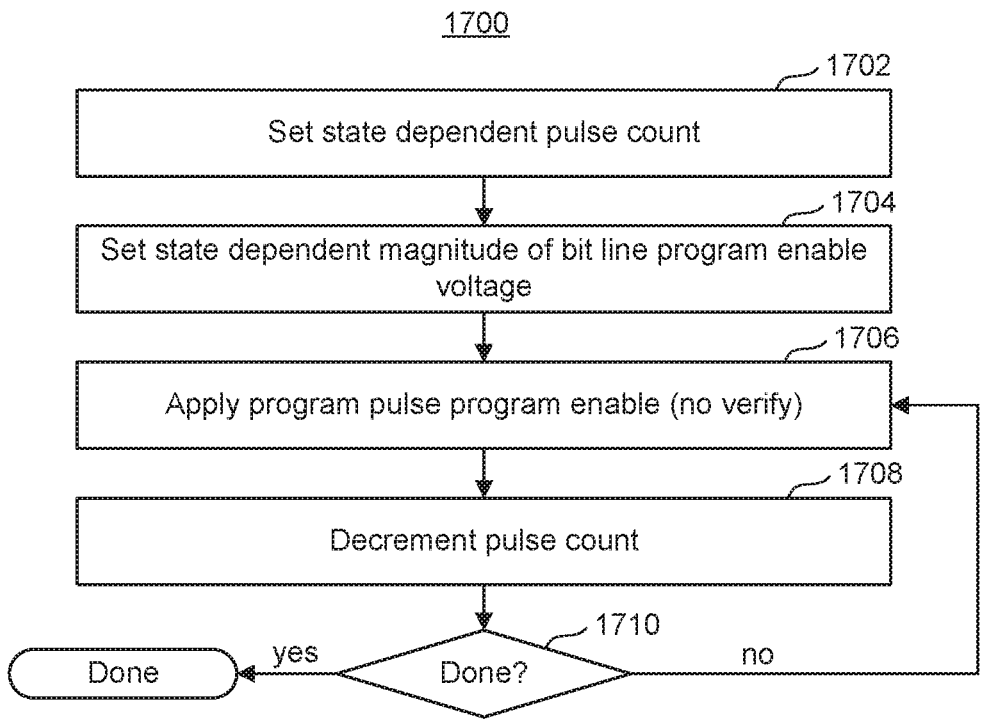
FIG. 17A is a flowchart of one embodiment of a process of predictive programming.
FIG. 17B shows a table of voltages that may be applied to bit lines during one embodiment of the process of FIG. 17A.

FIG. 17A is a flowchart of one embodiment of a process 1700 of predictive programming. The process 1700 is described with respect to programming one memory cell. The process 1700 is one embodiment of step 1112 of process

1100. Thus, process 1600 is one embodiment of predictive programming of memory cells having a Vt of greater then VH when the memory cell first reaches its checkpoint state. The process is used during the foggy program phase of a foggy-fine program scheme, in one embodiment. In one embodiment, process 1700 is used in combination with process 1500 (which may be used for predictive programming of memory cells having a Vt between VL and VH when the memory cell first reaches its checkpoint state). For example, process 1500 may be used in step 1110 of process 1100 and process 1700 may be used in step 1112 of process 1000.

FIG. 17A will be discussed in connection with the table 1750 FIG. 17B, which depicts one embodiment of voltages applied to bit lines during predictive programming. The table 1750 covers three non-CP states, which are defined based on their Vt relative to the checkpoint state. Table 1750 is for memory cells having a Vt above a verify high reference level (VH) when the memory cell first reaches the checkpoint state. Table 1750 refers to a voltage "PE_max". As one example, PE_max in table 1750 is 0.5V, but could be higher or lower. The gamma (γ) refers to a parameter for defining a different magnitude voltage for each state for a given program pulse. In one embodiment, gamma (γ) is related to alpha in table 1550. In one embodiment, gamma is smaller than alpha. Since gamma is subtracted from PE_max, a smaller gamma results in a larger magnitude for the weak program enable voltage, which may result in slower (less) programming of the memory cells in process 1700 relative to process 1500. In table 1750, the program enable voltages have state dependent strengths at least because the average magnitude of the program enable voltages depends on the target state. The program enable voltages are also an example of state dependent average voltage magnitudes.

Step 1702 includes setting a state dependent pulse count for the memory cell. With reference to table 1750, the count is set to n+1, in one embodiment. For example, the count may be set to two for CP+1, three for CP+2, and four for CP+3. Thus, "n+1" program pulses are applied to the memory cells with the weak program enable voltage applied to the bit line without verifying the memory cells, in one embodiment. The count is maintained in a set of latches, in one embodiment. For example, the count could be maintained in latches in managing circuit 190 in sense block 51 (e.g., one or more of UDL, MDL, LDL, or other latches).

Step 1704 includes setting a state dependent magnitude of the bit line program enable voltage for the memory cell. These are weak program enable voltages, in one embodiment. Table 1750 indicates one technique for establishing the state dependent magnitudes. As one example, if PE_max is 0.5V and gamma (a) is 0.05V then the state dependent magnitudes are 0.45V, 0.4V, and 0.35V for CP+1, CP+2, and CP+3, respectively.

Step 1706 includes applying a program pulse to a memory cell with the weak program enable voltage applied to the bit line coupled to the memory cell. Program verify is not performed for the memory cell being predictively programmed after this program pulse.

Step 1708 includes decrementing the pulse count. In one embodiment, this includes changing a value in a data latch in sense block 51. Step 1710 is a determination of whether predictive programming is complete for this memory cell. This determination is based on the status of the data latches in the sense block 51, in one embodiment. If the process 1700 is not complete, then step 1706 is performed again. After the state dependent number of program pulses have been applied to the memory cell (as tested in step 1710), the memory cell has been predictively programmed to its target state. Table 1750 shows that program inhibit voltages may be applied to bit lines afterwards to keep the memory cells from being over-programmed.

Figures 18A, 18B:
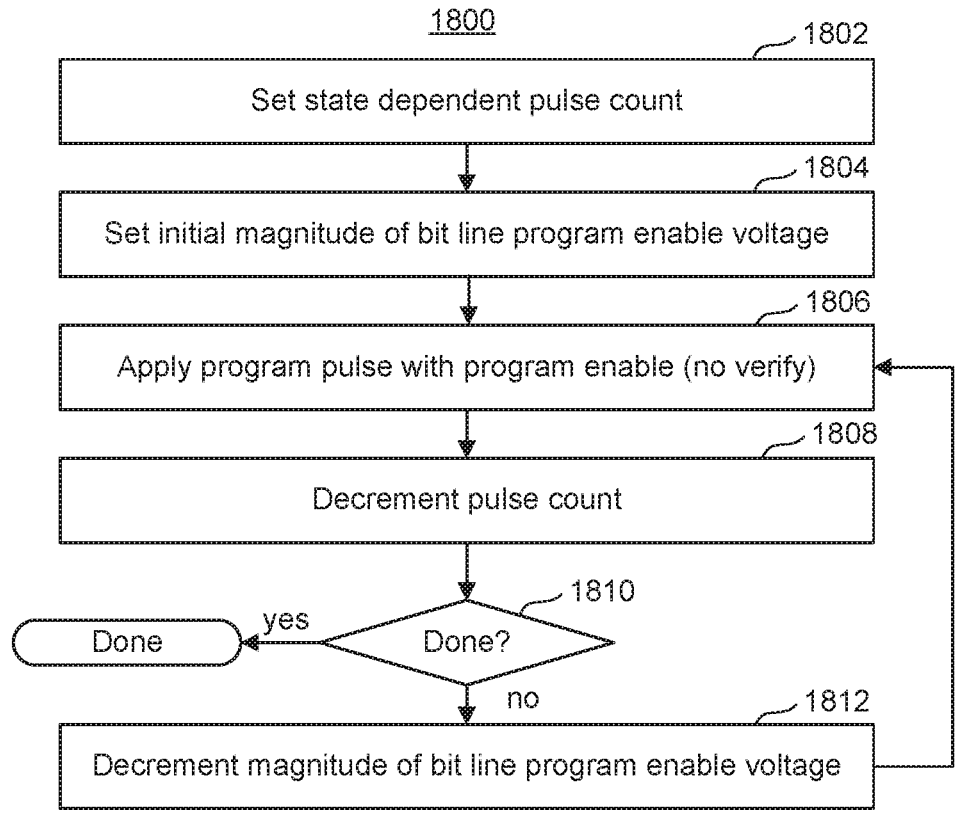
FIG. 18A is a flowchart of one embodiment of a process of predictive programming.
FIG. 18B shows a table of voltages that may be applied to bit lines during one embodiment of the process of FIG. 18A.

FIG. 18A is a flowchart of one embodiment of a process 1800 of predictive programming. The process 1800 is described with respect to programming one memory cell. The process 1800 is one embodiment of step 1110 of process 1100. The process 1800 is similar to process 1400, but reverses the order in which the weak program enable voltages are applied to the bit lines. A difference between process 1400 and process 1800 is that the bit line voltage is decremented in step 1812 (whereas the bit line voltage is incremented in step 1412). The process 1800 is used during the foggy program phase of a foggy-fine program scheme, in one embodiment.

FIG. 18A will be discussed in connection with the table 1850 FIG. 18B, which depicts one embodiment of voltages applied to bit lines during predictive programming. The table 1850 covers three non-CP states, which are defined based on their Vt relative to the checkpoint state. Table 1850 is for memory cells having a Vt between a verify low reference level (VL) and a verify high reference level (VH) when the memory cell first reaches the checkpoint state. Table 1850 refers to a voltage "PE_max", which is the highest magnitude program enable voltage in table 1850. As one example, PE_max is 0.5V. The delta (Δ) refers to a decrement from one program pulse to the next. For ease of comparison with process 1400, the parameter delta (Δ) is used in both table 1450 and 1850. In one embodiment, delta (Δ) in table 1850 is 0.1V. However, delta in table 1850 could be larger or smaller. In table 1850, the program enable voltages have state dependent strengths at least because the average magnitude of the program enable voltages depends on the target state. The program enable voltages are also an example of state dependent average voltage magnitudes.

Step 1802 includes setting a state dependent pulse count for the memory cell. With reference to table 1850, the count is set to n+1, in one embodiment. For example, the count may be set to two for CP+1, three for CP+2, and four for CP+3. Thus, "n+1" program pulses are applied to the memory cells with the weak program enable voltage applied to the bit line without verifying the memory cells, in one embodiment. The count is maintained in a set of latches, in one embodiment. For example, the count could be maintained in latches in managing circuit 190 in sense block 51 (e.g., one or more of UDL, MDL, LDL, or other latches).

Step 1804 includes setting an initial magnitude of the bit line program enable voltage for the memory cell. These are weak program enable voltages, in one embodiment. Table 1850 indicates one technique for establishing the magnitudes.

Step 1806 includes applying a program pulse to a memory cell with the weak program enable voltage applied to the bit line coupled to the memory cell. Program verify is not performed for the memory cell being predictively programmed after this program pulse.

Step 1808 includes decrementing the pulse count. In one embodiment, this includes changing a value in a data latch in sense block 51. Step 1810 is a determination of whether predictive programming is complete for this memory cell. This determination is based on the status of the data latches in the sense block 51, in one embodiment. If the process 1800 is not complete, then step 1812 is performed.

Step 1812 includes decrementing a magnitude of the bit line program enable voltage. The decrement is previously discussed delta in table 1850, in one embodiment. In one embodiment, the decrement is the same for each program pulse. However, in one embodiment, the decrement is different for at least one of the pulses. In one embodiment, the decrement is the same for each state. However, in one embodiment, the decrement is different for at least one of the states. Thus, referring to table 1850, one or more of the deltas may be replaced by a decrement having a different magnitude than delta in table 1850.

After step 1812, the process returns to step 1806 to apply another program pulse with the decremented program enable voltage. After the state dependent number of program pulses have been applied to the memory cell (as tested in step 1810), the memory cell has been predictively programmed to its target state. Table 1850 shows that program inhibit voltages may be applied to bit lines afterwards to keep the memory cells from being over-programmed.

Similar to how table 1450 (and process 1400) can be modified to reverse the order in which the weak program enable voltages are applied, other tables and processes described herein can be modified. For example, table 1250 can be modified to first apply the weak program enable voltage, followed by applying the one or more full program enable voltages. As another example, table 1650 (see FIG. 16B) can be modified to reverse the order in which the program enable voltages are applied for each state. In connection with this modification to table 1650, step 1612 in process 1600 can be modified to decrement the magnitude of the bit line voltage.

Figure 19:
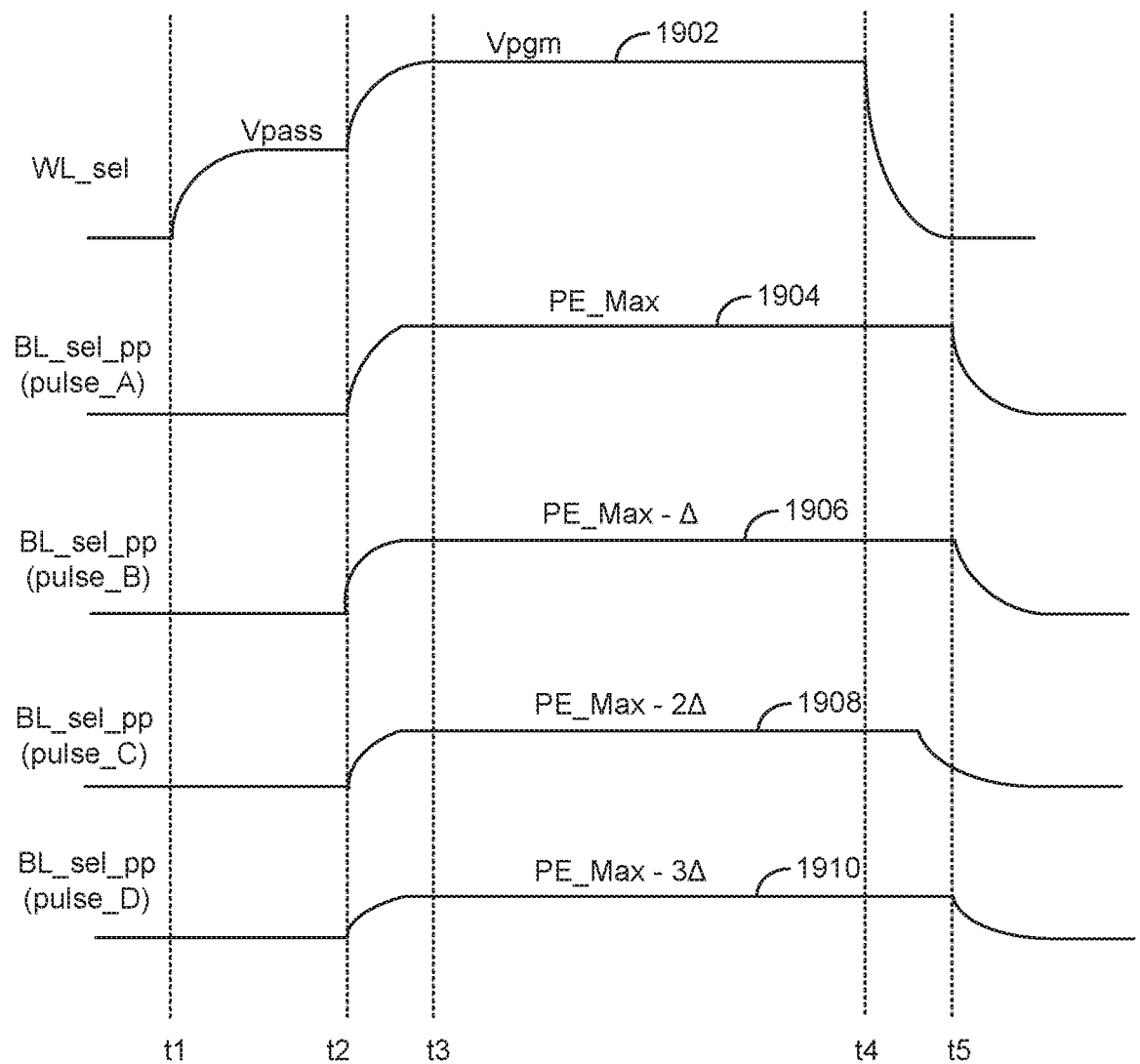
FIG. 19 shows voltage waveforms that may be applied to the selected word line (WL) and the bit lines (BL) during embodiments of predictive programming.

FIG. 19 shows voltage waveforms that may be applied to the selected word line (WL) and the bit lines (BL) during embodiments of predictive programming. These waveforms may be used with predictive programming based on checkpoints. The waveforms may be used in process 1000, 1100, 1200, 1300, 1400, 1500, 1600, 1700, or 1800, but are not limited thereto. FIG. 19 shows timing for a waveform 1902 applied to the selected word line (WL_sel), and four different waveforms (1904, 1906, 1908, 1910) for voltages applied to a bit line of a memory cell being predictively programmed. These waveforms correspond to four different program pulses. These pulses are referred to as pulse_A, pulse_B, pulse_C, and pulse_D, to refer to four different program voltages (e.g., Vpgm) applied to the selected word line.

Referring now to waveform 1902, the selected word line voltage is changed from a steady state value to a voltage VPASS starting at time t1. The voltage VPASS is maintained on the selected word line until time t2. At time t2, the voltage on the selected word is increased towards the program voltage Vpgm. By time t3, the selected word line has reached the program voltage. The selected word line is held at Vpgm until time t4, after which the voltage is decreased to the steady state value. The magnitude of Vpgm is increased from one program loop to the next, in some embodiments. The voltage VPASS may also be applied to unselected word lines (not depicted in FIG. 19). The voltage VPASS may be referred to as a boosting voltage, which boosts channels of unselected NAND strings to prevent programming of unselected memory cells, in one embodiment. In other words, the voltage VPASS boosts the channels of NAND strings that are coupled to bit lines that are biased at a program inhibit voltage.

Referring now to waveforms 1904, 1908, 1908, and 1910, the selected bit line voltage is at a steady state value prior to time t2. An example of the steady state value is 0V. The selected bit line voltage is increased to the program enable voltage starting at time t2. Note that the selected bit line voltage could be increased at an earlier time, such as at time t1. Four different magnitudes of the weak enable voltage are depicted in FIG. 19. Waveform 1904 has a magnitude of PE_Max. Waveform 1906 has a magnitude of PE_Max−Δ. Waveform 1908 has a magnitude of PE_Max−2Δ. Waveform 1910 has a magnitude of PE_Max−3Δ. These waveforms may be used to implement the bit line voltage in table 1450 (see FIG. 14B) or table 1850 (see FIG. 18B). Bit line voltages in other tables disclosed herein can be realized by replacing delta with another parameter. For example, bit line voltages in table 1550 can be realized by replacing delta with alpha, bit line voltages in table 1650 can be realized by replacing delta with beta, and bit line voltages in table 1750 can be realized by replacing delta with gamma.

Figure 20:
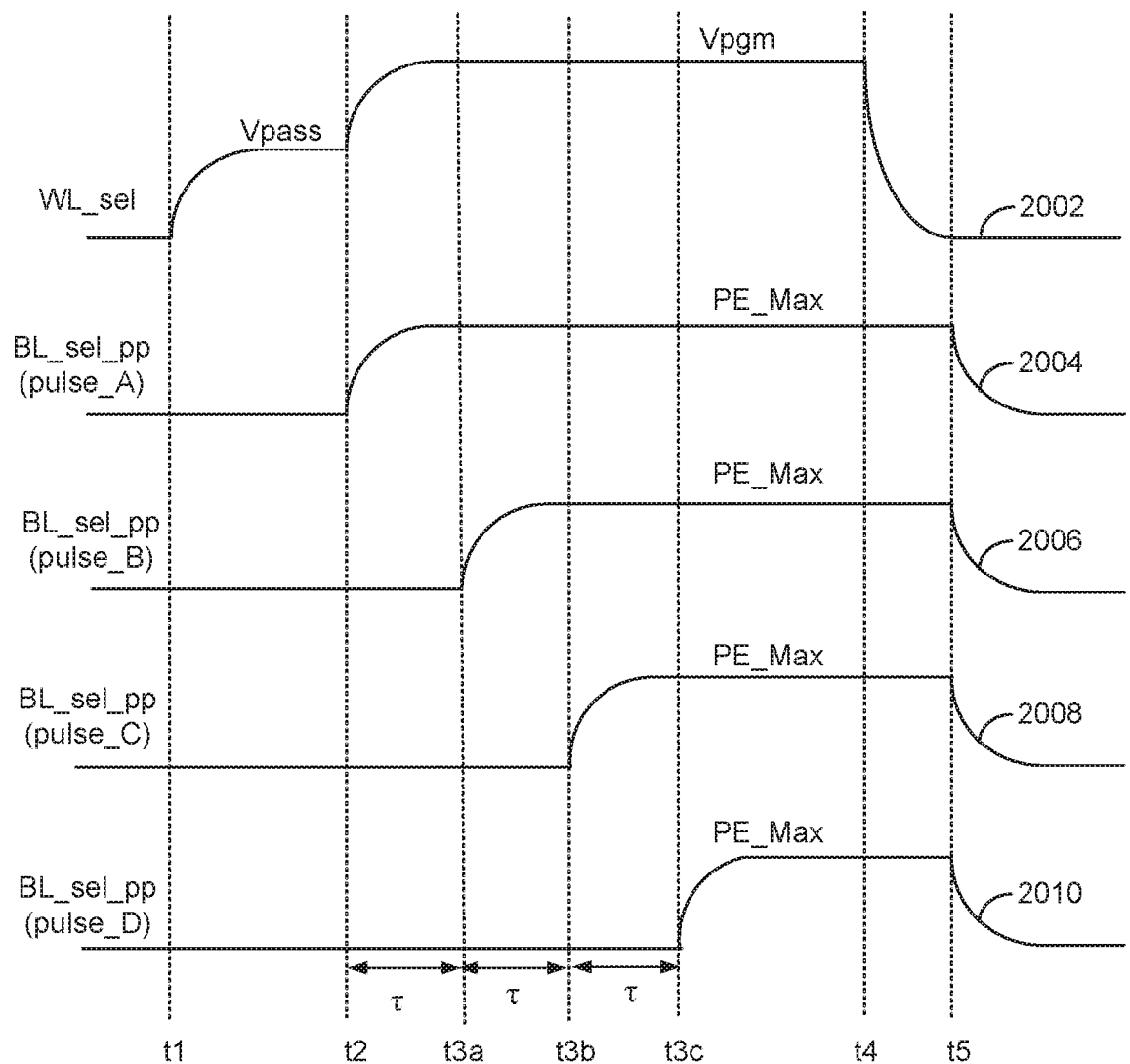
FIG. 20 shows voltage waveforms that may be applied to the selected word line (WL) and the bit lines (BL) during embodiments of predictive programming.

Managing the magnitudes of the program enable bit line voltages is one embodiment of managing the strength of the program enable voltages. In another embodiment the time for which weak program enable voltages are applied to the bit line is managed in order to apply program enable voltages having different strengths to bit lines during predictive programming. FIG. 20 depicts voltages waveforms for one embodiment in which the time for which weak program enable voltages are applied to the bit line is managed. The time for which a full program enable is applied to the bit line may also be managed.

FIG. 20 shows timing for a waveform 2002 applied to the selected word line (WL_sel), and four different waveforms (2004, 2006, 2008, 2010) for voltages applied to a bit line of a memory cell being predictively programmed. These four waveforms correspond to four different program pulses. These pulses are referred to as pulse_A, pulse_B, pulse_C, and pulse_D, to refer to four different program voltages (e.g., Vpgm) applied to the selected word line.

Referring now to waveform 2002, the selected word line voltage is changed from a steady state value to a voltage VPASS starting at time t1. The voltage VPASS is maintained on the selected word line until time t2. At time t2, the voltage on the selected word is increased towards the program voltage Vpgm. The selected word line is held at Vpgm until time t4, after which the voltage is decreased to the steady state value. The magnitude of Vpgm is increased from one program loop to the next, in some embodiments. The voltage VPASS may also be applied to unselected word lines (not depicted in FIG. 20). The voltage VPASS may be referred to as a boosting voltage, which boosts channels of unselected NAND strings to prevent programming of unselected memory cells, in one embodiment.

Referring now to waveform 2004 the selected bit line voltage is at a steady state value prior to time t2. An example of the steady state value is 0V. In one embodiment, the steady state value is equal in magnitude to the full program enable voltage. The bit line voltage is increased to the weak program enable voltage (e.g., PE_Max) starting at time t2. The bit line voltage is maintained at PE_Max until time t5, when it is reduced to the steady state value.

Referring now to waveform 2006 the selected bit line voltage is at a steady state value prior to time t3a. In one embodiment, the steady state value is equal in magnitude to the full program enable voltage. The bit line voltage is increased to the weak program enable voltage (PE_Max) starting at time t3a. The bit line voltage is maintained at PE_Max until time t5, when it is reduced to the steady state value. Note that the bit line may be at the full program enable voltage (e.g., 0V) between time t2 and t3a.

Referring now to waveform 2008 the selected bit line voltage is at a steady state value prior to time t3b. In one embodiment, the steady state value is equal in magnitude to the full program enable voltage. The bit line voltage is increased to the weak program enable voltage (PE_Max) starting at time t3b. The bit line voltage is maintained at PE_Max until time t5, when it is reduced to the steady state value. Note that the bit line may be at the full program enable voltage (e.g., 0V) between time t2 and t3b.

Referring now to waveform 2010 the selected bit line voltage is at a steady state value prior to time t3c. In one embodiment, the steady state value is equal in magnitude to the full program enable voltage. The bit line voltage is increased to the weak program enable voltage (PE_Max) starting at time t3c. The bit line voltage is maintained at PE_Max until time t5, when it is reduced to the steady state value. Note that the bit line may be at the full program enable voltage (e.g., 0V) between time t2 and t3c.

The memory cell receives the weakest programming when waveform 2004 is used and the strongest programming when waveform 2010 is used, assuming the same magnitude of Vpgm is applied to the selected word line. The order of the strength of programming (weakest to strongest) is thus waveform 2004, waveform 2006, waveform 2008, and waveform 2010.

Another way to analyze the waveforms 2004, 2006, 2008, and 2010 is that these waveforms have different averages for the magnitude of the program enable voltage while the program voltage (Vpgm) is applied to the selected word line. The order of the averages for the magnitude of the program enable voltage is: waveform 2004, waveform 2006, waveform 2008, waveform 2010. A higher average for the magnitude of the program enable voltage results in weaker programming, in one embodiment.

Figures 21A, 21B:
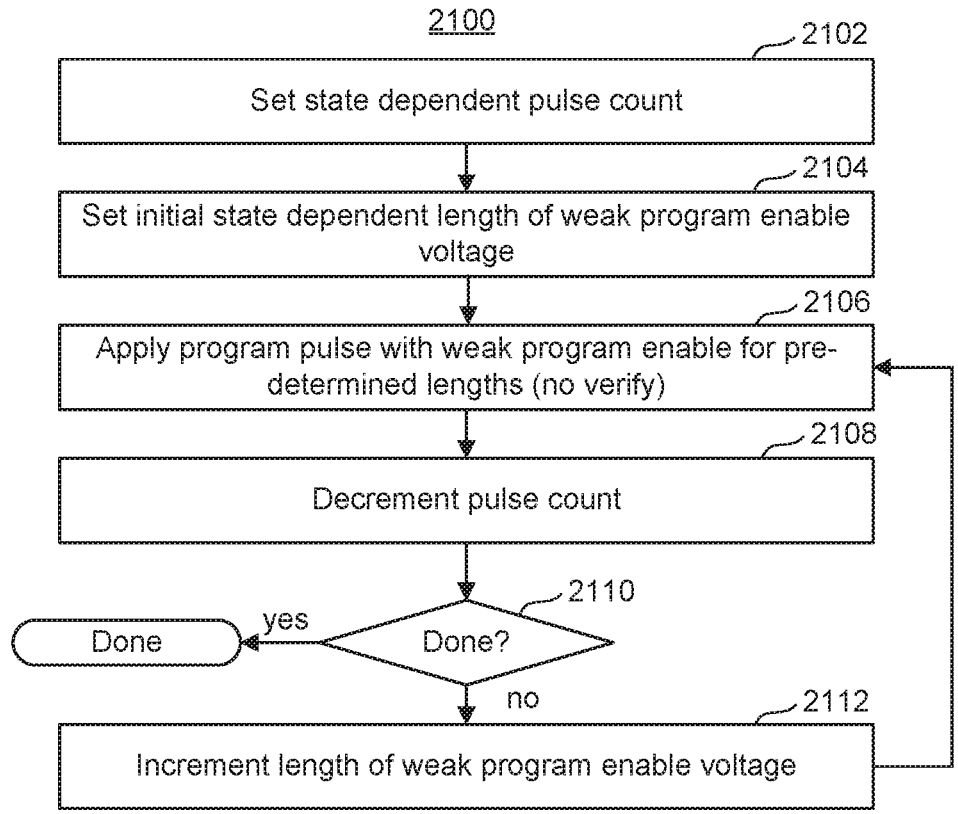
FIG. 21A is a flowchart of one embodiment of a process of predictive programming.
FIG. 21B shows a table of voltages that may be applied to bit lines during one embodiment of the process of FIG. 21A.
Figures 22A, 22B:
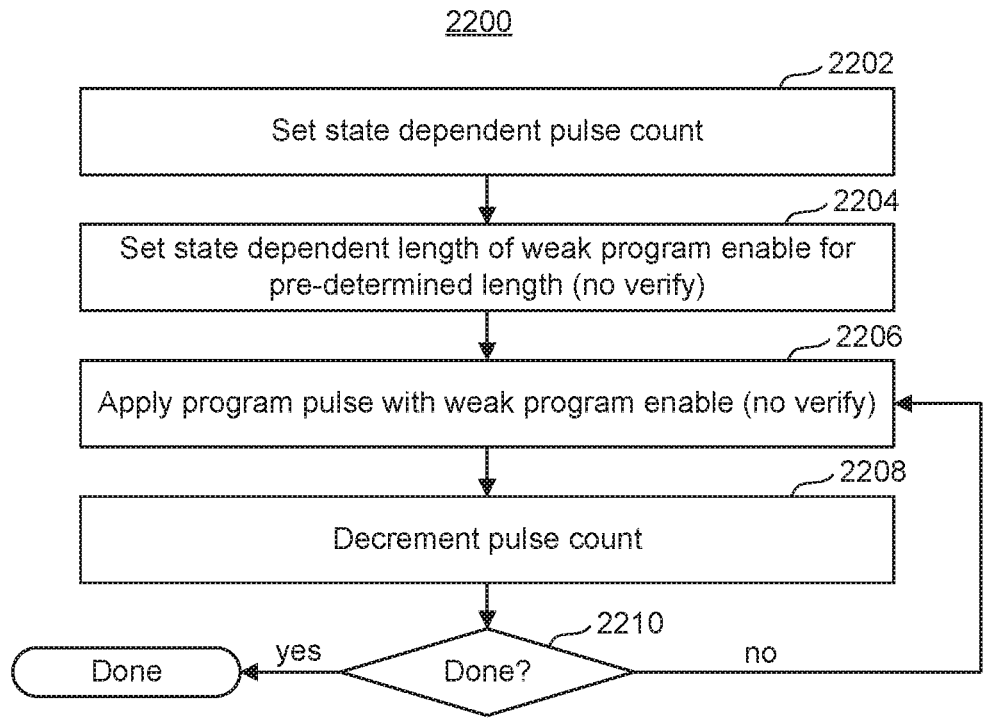
FIG. 22A is a flowchart of one embodiment of a process of predictive programming.
FIG. 22B shows a table of voltages that may be applied to bit lines during one embodiment of the process of FIG. 22A.

FIG. 21A is a flowchart of one embodiment of a process 2100 of predictive programming. The process 2100 is described with respect to programming one memory cell. The process 2100 is one embodiment of step 1110 of process 1100. The process is used during the foggy program phase of a foggy-fine program scheme, in one embodiment. FIG. 21A will be discussed in connection with the table 2150 FIG. 21B, which depicts one embodiment of voltages applied to bit lines during predictive programming. The table 2150 covers three non-CP states, which are defined based on their Vt relative to the checkpoint state. Table 2150 is for memory cells having a Vt between a verify low reference level (VL) and a verify high reference level (VH) when the memory cell first reaches the checkpoint state. Table 2150 refers to a time "t_max", which is the longest time for which the weak program enable voltage is applied in table 2150. With reference to FIG. 20, t_max is the time between t3a and t4, in one embodiment. The parameter tau (τ) is used to manage the length of time for which the weak program enable voltage is applied to the bit line. With reference to FIG. 20, the time between t3a and t3b is equal to τ, in one embodiment. With reference to FIG. 20, the time between t3b and t3c is equal to τ, in one embodiment. With reference to FIG. 20, the time between t3c and t3d is equal to τ, in one embodiment. In table 2150, the program enable voltages have state dependent strengths at least because the average time for which the weak program enable voltages are applied depends on the target state. The program enable voltages are also an example of state dependent program enable voltage durations.

With reference to FIG. 21A, step 2102 includes setting a state dependent pulse count for the memory cell. With reference to table 2150, the count is set to n+1, in one embodiment. For example, the count may be set to two for CP+1, three for CP+2, and four for CP+3. Thus, "n+1" program pulses are applied to the memory cells with the weak program enable voltage applied to the bit line without verifying the memory cells, in one embodiment. The count is maintained in a set of latches, in one embodiment. For example, the count could be maintained in latches in managing circuit 190 in sense block 51 (e.g., one or more of UDL, MDL, LDL, or other latches).

Step 2104 includes setting an initial state dependent length of the weak program enable voltage for the memory cell. These are weak program enable voltages, in one embodiment. Table 2150 indicates one technique for establishing the initial state dependent lengths. With reference to FIG. 20, tmax–τ may correspond to waveform 2006, tmax–2τ may correspond to waveform 2008, and tmax–3τ may correspond to waveform 2010. Step 2104 may also include setting an initial state dependent length of the full program enable voltage for the memory cell. Stated in other terms, step 2104 may include setting an initial state dependent average magnitude of the program enable voltage for the memory cell.

Step 2106 includes applying a program pulse to a memory cell with the weak program enable voltage applied to the bit line for a pre-determined time. Note that the full program enable may also be applied for a portion of the time that the program pulse is applied to the memory cell (see FIG. 20). Program verify is not performed for the memory cell being predictively programmed after this program pulse.

Step 2108 includes decrementing the pulse count. In one embodiment, this includes changing a value in a data latch in sense block 51. Step 2110 is a determination of whether predictive programming is complete for this memory cell. This determination is based on the status of the data latches in the sense block 51, in one embodiment. If the process 2100 is not complete, then step 2112 is performed.

Step 2112 includes incrementing a length of the weak program enable voltage. The increment is the previously discussed tau (τ), in one embodiment. In one embodiment, the increment is the same for each program pulse. However, in one embodiment, the increment is different for at least one of the pulses. In one embodiment, the increment is the same for each state. However, in one embodiment, the increment is different for at least one of the states. Thus, referring to table 2150, one or more of the taus (τ), may be replaced by an increment having a different magnitude than tau. Step 2112 may also include decrementing the length of the full program enable voltage. Stated in other terms, step 2112 may include incrementing the average magnitude of the program enable voltage.

After step 2112, the process returns to step 2106 to apply another program pulse with the incremented length of time for the weak program enable voltage. For example, if the memory cell is a CP+1 state, then the time may be incremented from tmax–τ to tmax. With reference to FIG. 19, this corresponds to applying waveform 2004 in this iteration (as opposed to waveform 2006 in the previous iteration).

After the state dependent number of program pulses have been applied to the memory cell (as tested in step 2110), the memory cell has been predictively programmed to its target state. Table 2150 shows that program inhibit voltages may be applied to bit lines afterwards to keep the memory cells from being over-programmed.

FIGS. 21A and 21B depict how process 1400 (FIG. 14A) and table 1450 (FIG. 14B) may be modified to manage program enable strength based on the length of for which the weak enable voltage is applied to the bit line, as opposed to managing the magnitude of the weak enable voltage applied to the bit line. The concept of managing the length of time may be applied to other tables and processes described herein. FIG. 22A depicts a process 2200 that is a modification of process 1500 (FIG. 15A). Table 2250 in FIG. 22B is a modification of table 1550 (FIG. 15B). Table 22B is similar to table 2150 (see FIG. 21B) and will not be described in detail. The waveforms in FIG. 20 may be used to implement the bit line voltages in table 2250. Process 2200 is similar to process 2100 and will not be described in detail. A difference between the two processes is that for each state the length of time for which the weak program enable voltage is applied to the bit line is the same for each of the pulses (in step 2206). Step 2202 includes setting a state dependent pulse count for the memory cell. Step 2204 includes setting an initial state dependent length of the weak program enable voltage for the memory cell. Step 2206 includes applying a program pulse to a memory cell with the weak program enable voltage applied to the bit line for a pre-determined time. Step 2208 includes decrementing the pulse count. Step 2210 is a determination of whether predictive programming is complete for this memory cell.

Recall that FIGS. 16A and 16B describe an embodiment that applies to memory cells that have a Vt above VH when the memory cell reaches the checkpoint state. Process 1600 and table 1650 may be modified to manage the strength of the program enable voltage based on time instead of magnitude. For example, table 1650 can be modified to resemble table 2250 (FIG. 22B). Recall also the process 1600 is used in combination with process 1400 (which may be used for predictive programming of memory cells having a Vt between VL and VH when the memory cell reaches its checkpoint state). Further recall that process 1600 may result in slower (e.g., weaker) programming of the memory cells in relative to process 1400. To achieve slower (e.g., weaker) programming for memory cells that have a Vt above VH when managing time the value for tau may be decreased. For example, with reference to FIG. 20, if tau is made shorter for waveform 2006, this will increase the length of time for which the weak program enable is applied (and decrease the length of time for which the full program enable is applied). Therefore, programming will be weaker.

Recall that FIGS. 17A and 17B describe an embodiment that applies to memory cells that have a Vt above VH when the memory cell reaches the checkpoint state. Process 1700 and table 1750 may be modified to manage the strength of the program enable voltage based on time instead of magnitude. For example, table 1750 can be modified to resemble table 2250 (FIG. 22B). Recall also the process 1700 is used in combination with process 1500 (which may be used for predictive programming of memory cells having a Vt between VL and VH when the memory cell reaches its checkpoint state). Further recall that process 1700 may result in slower (e.g., weaker) programming of the memory cells in relative to process 1500. As noted above, to achieve slower (e.g., weaker) programming for memory cells that have a Vt above VH when managing time the value for tau may be decreased.

Whereas process 2100 (FIG. 21A) described incrementing the length of time for which the weak program enable voltage is applied to the bit line with each program pulse, the length of time may be decremented with each program pulse. Thus, table 2150 (FIG. 21B) can be modified to reverse the order (similar to how table 1850 reverses the magnitudes relative to table 1450).

Figure 23:
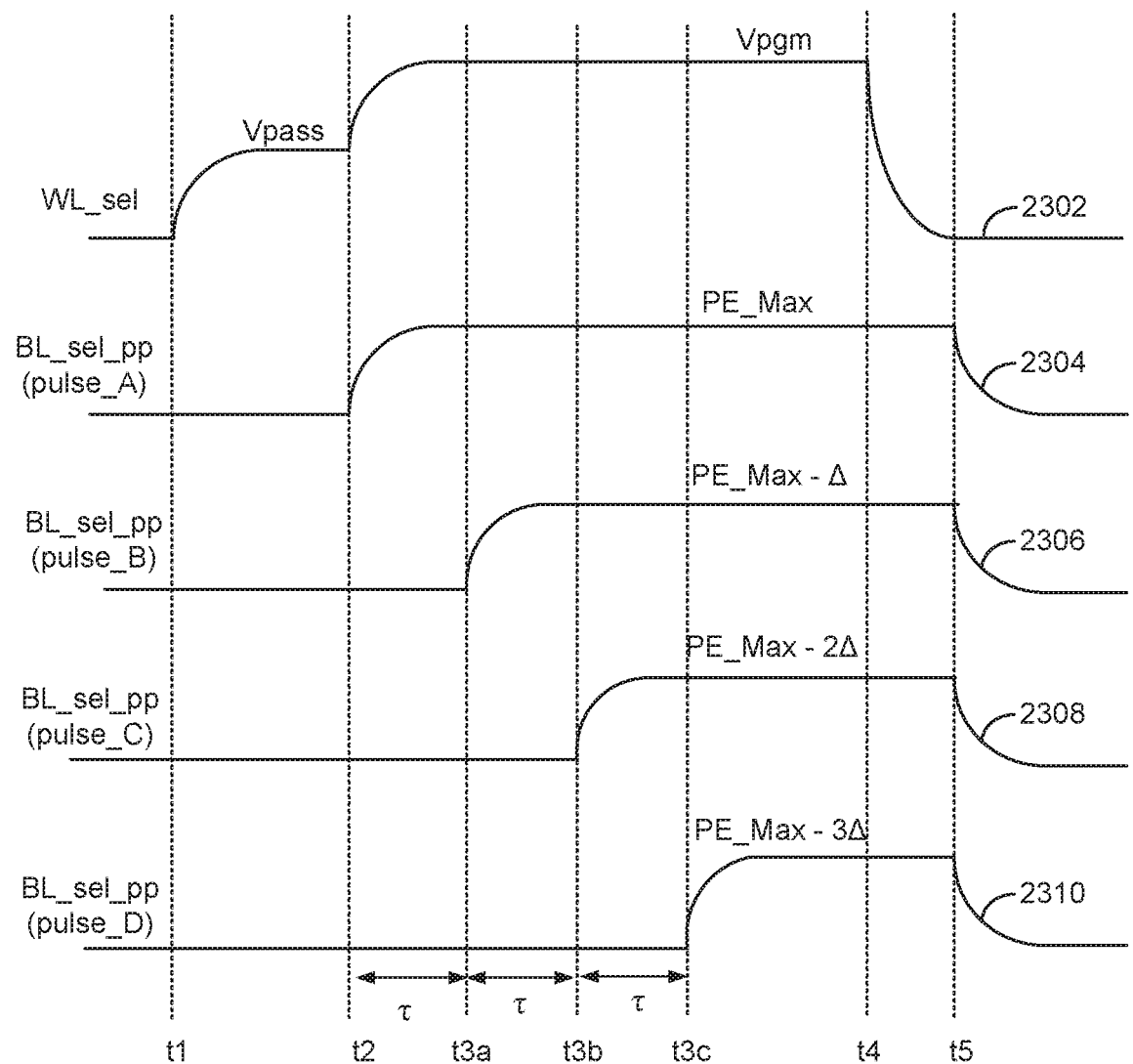
FIG. 23 shows voltage waveforms that may be applied to the selected word line (WL) and the bit lines (BL) during embodiments of predictive programming.

Still other modifications of managing the program enable voltage applied to the bit line are possible. In one embodiment, both the magnitude and the time are managed in order to manage the strength of the program enable voltage. FIG. 23 depicts voltage waveforms that may be used during one embodiment of predictive programming. Waveform 2302 depicts the voltage applied to the selected word line. Four different waveforms (2304, 2306, 2308, 2310) are for voltages applied to a bit line of a memory cell being predictively programmed. These four waveforms correspond to four different program pulses. The strength of programming increases from weakest to strongest in the order: waveform 2304, waveform 2306, waveform 2308, and waveform 2310. In this embodiment, decreasing the magnitude of the weak program enable voltage increases the program strength. Also, decreasing the time for which the weak program enable voltage is applied (and increasing the time for which the full program enable voltage is applied) increases the program strength. This both of these factors (magnitude, time) may be used to manage the strength of the weak program enable voltage. Various processes and tables described herein may be modified to use the waveforms 2304-2310 depicted in FIG. 23.

A first embodiment disclosed herein includes an apparatus comprising: non-volatile memory cells; a plurality of bit lines associated with the non-volatile memory cells; and a programming circuit. The programming circuit is configured to program memory cells to a verify low voltage. The programming circuit is configured program a set of the memory cells to target states. The set comprises memory cells having a threshold voltage between the verify low voltage and a verify high voltage. To program the set of the memory cells to the target states, the programming circuit is configured to apply two or more program pulses to memory cells in the set without verifying whether the memory cells have reached their respective target states, including: apply a first program enable voltage to the bit lines associated with the memory cells for at least one of the two or more program pulses; and apply a second program enable voltage to the bit lines associated with the memory cells for at least one of the two or more program pulses, the second program enable voltage having a different strength than the first program enable voltage.

A second embodiment, in furtherance of the first embodiment, comprises the programming circuit applying the first program enable voltage to the bit lines before applying the second program enable voltage to the bit lines.

In a third embodiment, in furtherance of the first or the second embodiments, the set of memory cells having a threshold voltage between the verify low voltage and the verify high voltage is a first set. The programming circuit is further configured to: program a second set of the memory cells having a threshold voltage above the verify high voltage to respective target states, including: apply "n" program voltages to the memory cells in the second set without verifying the memory cells in the second set, including apply the first program enable voltage to the bit lines associated with the memory cells in the second set for all of the "n" program voltages, wherein "n" is the number of states until the memory cell reaches its target state beyond the state defined by the verify high voltage.

In a fourth embodiment, in furtherance of any of the first to third embodiments, the programming circuit is further configured to apply a program inhibit voltage to the bit lines associated with the memory cells in the set that have received the two or more program pulses while other memory cells are being programmed to their respective target states.

In a fifth embodiment, in furtherance of any of the first to fourth embodiments, the programming circuit programs the memory cells using multi-pass programming such that the target states of the memory cells satisfy a first pass of multi-pass programming; and the programming circuit is further configured to program the memory cells from the first pass to a second pass.

In a sixth embodiment, in furtherance of any of the first to fifth embodiments, the non-volatile memory cells reside in a 3D NAND memory array.

In a seventh embodiment, in furtherance of any of the first to sixth embodiments, the first program enable voltage has a smaller magnitude than the second program enable voltage.

In an eighth embodiment, in furtherance of any of the first to sixth embodiments, the first program enable voltage comprises a full program enable voltage applied for a first time period and weak program enable voltage applied for a second time period. The second program enable voltage comprises the full program enable voltage applied for a third time period that is longer than the first time period and the weak program enable voltage applied for a fourth time period that is shorter than the second time period.

One embodiment includes a method for programming memory cells. The method comprises applying a full program enable voltage to bit lines coupled to memory cells associated with a checkpoint state while applying one or more program voltages to control gates of the memory cells. The method further includes identifying a set of memory cells that satisfy a verify low voltage for the checkpoint state in response to applying each of the one or more program voltages, memory cells of the set having a threshold voltage between the verify low voltage and a verify high voltage. The method further includes predictively programming the set of memory cells to respective target states. Predictively programming comprises applying a combination of the full program enable voltage and a weak program enable voltage to bit lines associated with the memory cells in the set while applying additional program voltages to control gates of the memory cells in the set.

One embodiment includes an apparatus comprising: non-volatile memory cells; a plurality of bit lines associated with the non-volatile memory cells; and one or more control circuits. The one or more control circuits are configured to program and verify memory cells associated with a checkpoint state to a verify low voltage for the checkpoint state. The one or more control circuits are further configured to predictively program a set of the memory cells to respective non-checkpoint states associated with the checkpoint state, each memory cell in the set having a threshold voltage between the verify low voltage and a verify high voltage associated with the checkpoint state and a target state that is one of the non-checkpoint states. The predictively programming comprises the predictively program being configured to apply program enable voltages having state dependent average magnitudes to bit lines associated with the memory cells in the set while applying one or more additional program voltages to control gates of the memory cells in the set and without verifying whether the memory cells in the set are programmed to the respective non-checkpoint states.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   non-volatile memory cells;
   a plurality of bit lines associated with the non-volatile memory cells; and
   one or more control circuits configured to:
   program non-checkpoint non-volatile memory cells associated with a checkpoint state to a verify low voltage for the checkpoint state; and
   program a set of the non-checkpoint memory cells to respective non-checkpoint states associated with the checkpoint state, the set comprising memory cells having a threshold voltage between the verify low voltage and a verify high voltage for the checkpoint state after a respective memory cell first crosses the verify low voltage, the one or more control circuits are configured to program the set of the non-checkpoint memory cells to the respective non-checkpoint states by:
   applying two or more program pulses to each non-checkpoint memory cell in the set without verifying whether the non-checkpoint memory cells have reached their respective non-checkpoint states, including:
   applying a first program enable voltage to a bit line associated with a given non-checkpoint memory cell for at least one of the two or more program pulses; and
   applying a second program enable voltage to the bit line associated with the given non-checkpoint memory cell for at least one of the two or more program pulses, the second program enable voltage having a different strength than the first program enable voltage.

2. The apparatus of claim 1, wherein applying the two or more program pulses further comprises:
   applying the first program enable voltage to the bit line before applying the second program enable voltage to the bit line.

3. The apparatus of claim 1, wherein the set of memory cells having a threshold voltage between the verify low voltage and the verify high voltage is a first set, the programming circuit is further configured to:

program a second set of the memory cells having a threshold voltage above the verify high voltage to respective target states, including:

apply "n" program voltages to the memory cells in the second set without verifying the memory cells in the second set, including apply the first program enable voltage to the bit lines associated with the memory cells in the second set for all of the "n" program voltages, wherein "n" is the number of states until the memory cell reaches its target state beyond the state defined by the verify high voltage.

4. The apparatus of claim 1, wherein the programming circuit is further configured to:

apply a program inhibit voltage to the bit lines associated with the memory cells in the set that have received the two or more program pulses while other memory cells are programmed to their respective target states.

5. The apparatus of claim 1, wherein:

the programming circuit programs the memory cells using multi-pass programming such that the target states of the memory cells satisfy a first pass of multi-pass programming; and the programming circuit is further configured to program the memory cells from the first pass to a second pass.

6. The apparatus of claim 1, wherein:

the non-volatile memory cells reside in a 3D NAND memory array.

7. The apparatus of claim 1, wherein the first program enable voltage has a smaller magnitude than the second program enable voltage.

8. The apparatus of claim 1, wherein:

the first program enable voltage comprises a full program enable voltage applied for a first time period and weak program enable voltage applied for a second time period; and the second program enable voltage comprises the full program enable voltage applied for a third time period that is longer than the first time period and the weak program enable voltage applied for a fourth time period that is shorter than the second time period.

9. A non-volatile storage device, comprising:

non-volatile memory cells;

a plurality of bit lines associated with the non-volatile memory cells; and a programming circuit configured to:

program memory cells to a verify low voltage;

program a set of the memory cells to target states, the set comprising a first set of memory cells having a threshold voltage between the verify low voltage and a verify high voltage, the set comprising a second set of memory cells having a threshold voltage above the verify high voltage, the programming circuit is configured to program the set of memory cells to the target states by: applying two or more program pulses to memory cells in the first set without verifying whether the memory cells have reached their respective target states, including:

applying a first program enable voltage to the bit lines associated with the memory cells in the first set for at least one of the two or more program pulses; and applying a second program enable voltage to the bit lines associated with the memory cells in the first set for at least one of the two or more program pulses, the second program enable voltage having a different strength than the first program enable voltage; and apply "n" program voltages to the memory cells in the second set without verifying the memory cells in the second set, including apply the first program enable voltage to the bit lines associated with the memory cells in the second set for all of the "n" program voltages, wherein "n" is the number of states until the memory cell reaches its target state beyond the state defined by the verify high voltage.

10. The non-volatile storage device of claim 9, wherein:

the non-volatile memory cells reside in a 3D NAND memory array.

11. A non-volatile storage device, comprising:

non-volatile memory cells;

a plurality of bit lines associated with the non-volatile memory cells; and one or more control circuits configured to:

program memory cells to a verify low voltage; and program a set of the memory cells to target states, the set comprising memory cells having a threshold voltage between the verify low voltage and a verify high voltage, the one or more control circuits are configured to program the set of the memory cells to the target states by:

applying two or more program pulses to memory cells in the set without verifying whether the memory cells have reached their respective target states, including:

applying a first program enable voltage to the bit lines associated with the memory cells for at least one of the two or more program pulses, wherein the first program enable voltage comprises a full program enable voltage applied for a first time period and weak program enable voltage applied for a second time period; and applying a second program enable voltage to the bit lines associated with the memory cells for at least one of the two or more program pulses, the second program enable voltage having a different strength than the first program enable voltage, wherein the second program enable voltage comprises the full program enable voltage applied for a third time period that is longer than the first time period and the weak program enable voltage applied for a fourth time period that is shorter than the second time period.

12. The non-volatile storage device of claim 11, wherein:

the non-volatile memory cells reside in a 3D NAND memory array.

* * * * *